United States Patent
Kean

(10) Patent No.: US 12,206,369 B2
(45) Date of Patent: *Jan. 21, 2025

(54) HIGH FLUX DETECTION AND IMAGING USING CAPACITOR TRANSIMPEDANCE AMPLIFIER (CTIA)-BASED UNIT CELLS IN IMAGING DEVICES

(71) Applicant: Raytheon Company, Waltham, MA (US)

(72) Inventor: Bryan W. Kean, Denver, CO (US)

(73) Assignee: Raytheon Company, Arlington, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/165,713

(22) Filed: Feb. 7, 2023

(65) Prior Publication Data

US 2024/0267006 A1 Aug. 8, 2024

(51) Int. Cl.
   *H03F 3/08* (2006.01)
   *H03F 1/08* (2006.01)
   *H03F 3/00* (2006.01)

(52) U.S. Cl.
   CPC ............ *H03F 3/087* (2013.01); *H03F 1/083* (2013.01); *H03F 3/005* (2013.01); *H03F 2203/45551* (2013.01)

(58) Field of Classification Search
   CPC .......... H03F 3/087; H03F 1/083; H03F 3/005; H03F 2203/45551
   See application file for complete search history.

(56) References Cited

U.S. PATENT DOCUMENTS

| | | |
|---|---|---|
| 6,252,462 B1 | 6/2001 | Hoffman |
| 6,885,002 B1 | 4/2005 | Finch et al. |
| 6,927,796 B2 | 8/2005 | Liu et al. |
| 7,148,727 B2 | 12/2006 | Van Bogget |
| 9,621,829 B1 | 4/2017 | Boemler |
| 9,628,105 B1 | 4/2017 | Veeder |
| 10,242,268 B2 | 3/2019 | Harris et al. |

(Continued)

FOREIGN PATENT DOCUMENTS

| | | |
|---|---|---|
| CN | 107563202 B | 12/2020 |
| CN | 115914872 B | 3/2024 |
| TW | I287818 B | 10/2007 |

OTHER PUBLICATIONS

Notice of Allowance dated Oct. 3, 2023 in connection with U.S. Appl. No. 17/480,554, 13 pages.
Kean, "Artifact Mitigation in Capacitor Transimpedance Amplifier (CTIA)-Based Imagers Or Other Imaging Devices," U.S. Appl. No. 18/165,663, filed Feb. 7, 2023, 36 pages.
Boemler, "High-Energy Suppression for Infrared Imagers or Other Imaging Device," U.S. Appl. No. 17/480,554, filed Sep. 21, 2021, 32 pages.

(Continued)

Primary Examiner — Seung C Sohn

(57) ABSTRACT

An apparatus includes a photodetector configured to generate an electrical current based on received illumination. The apparatus also includes a capacitor transimpedance amplifier (CTIA) unit cell configured to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. The apparatus further includes a comparator configured to compare an input voltage of the amplifier and a second reference voltage, where generation of the integration voltage is modifiable based on the comparison.

20 Claims, 12 Drawing Sheets

(56) References Cited

U.S. PATENT DOCUMENTS

| | | | |
|---|---|---|---|
| 11,496,701 B2 * | 11/2022 | Cantrell | H04N 25/772 |
| 11,843,355 B2 * | 12/2023 | Kean | H03F 3/087 |
| 12,029,599 B2 * | 7/2024 | Cao | A61B 6/485 |
| 2003/0150979 A1 | 8/2003 | Lauffenburger et al. | |
| 2005/0199813 A1 | 9/2005 | Van Bogget | |
| 2008/0106297 A1 | 5/2008 | Jao | |
| 2011/0221520 A1 | 9/2011 | Bales | |
| 2012/0261553 A1 | 10/2012 | Elkind et al. | |
| 2012/0305786 A1 | 12/2012 | Dierickx | |
| 2013/0187028 A1 | 7/2013 | Salvestrini et al. | |
| 2014/0061472 A1 | 3/2014 | Salvestrini et al. | |
| 2017/0205283 A1 | 7/2017 | Wyles et al. | |
| 2018/0124336 A1 | 5/2018 | Jonas | |
| 2019/0313046 A1 | 10/2019 | McGee, III et al. | |
| 2019/0335118 A1 | 10/2019 | Simolon et al. | |
| 2023/0095511 A1 | 3/2023 | Boemler | |
| 2023/0253932 A1 | 8/2023 | Kean et al. | |
| 2023/0269502 A1 | 8/2023 | Black et al. | |

OTHER PUBLICATIONS

Kean et al., "High-Energy Suppression for Capacitor Transimpedance Amplifier (CTIA)-Based Imagers Or Other Imaging Devices," U.S. Appl. No. 17/649,994, filed Feb. 4, 2022, 30 pages.

Abbasi et al., "A PFM-Based Digital Pixel with an Off-Pixel Residue Measurement for Small Pitch FPAs", IEEE Transactions on Circuits and Systems—II: Express Briefs, vol. 64, No. 8, Aug. 2017, 5 pages.

Bisiaux et al., "A 14-b Two-step Inverter-based $\Sigma\Delta$ ADC for CMOS Image Sensor", 15th IEEE International New Circuits and Systems Conference, Nov. 2017, 4 pages.

Cantrell, "Digital Pixel Comparator with Bloom Transistor Frontend", U.S. Appl. No. 17/216,481, filed Mar. 29, 2021, 38 pages.

Non-Final Office Action dated Apr. 19, 2023 in connection with U.S. Appl. No. 17/480,554, 11 pages.

Notice of Allowance dated Mar. 15, 2023 in connection with U.S. Appl. No. 17/649,994, 9 pages.

Non-Final Office Action dated Jun. 18, 2024 in connection with U.S. Appl. No. 18/165,663, 9 pages.

\* cited by examiner

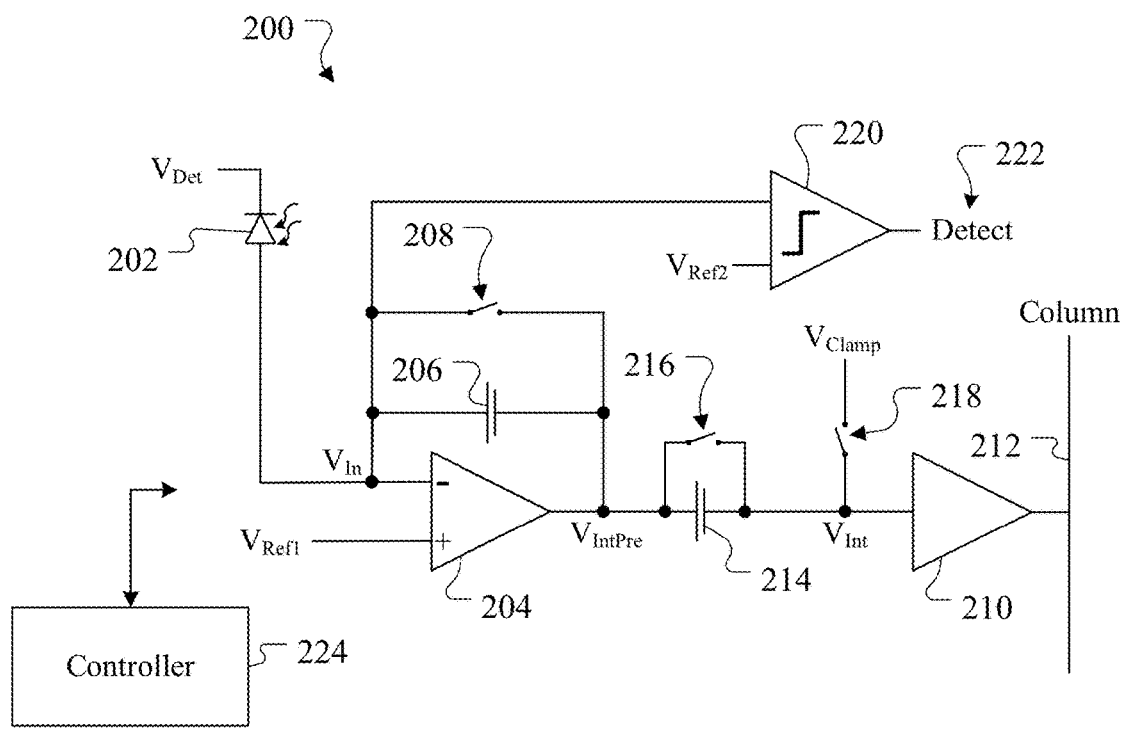
FIG. 2A
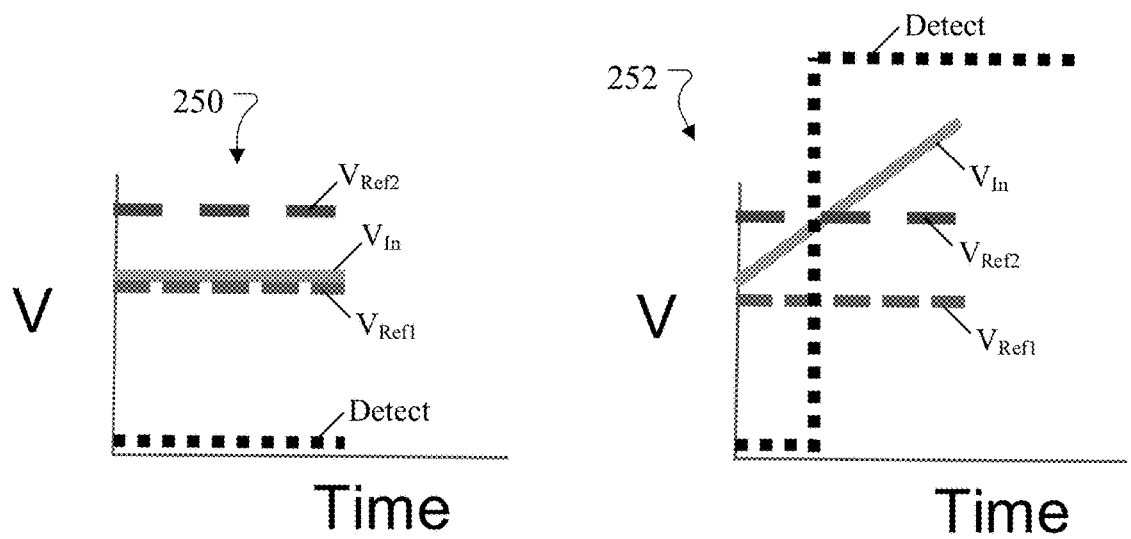
FIG. 2B
FIG. 2C

HIGH FLUX DETECTION AND IMAGING USING CAPACITOR TRANSIMPEDANCE AMPLIFIER (CTIA)-BASED UNIT CELLS IN IMAGING DEVICES

TECHNICAL FIELD

This disclosure relates generally to imaging systems. More specifically, this disclosure relates to high flux detection and imaging using capacitor transimpedance amplifier (CTIA)-based unit cells in imaging devices.

BACKGROUND

Digital imaging systems often use integrators to capture information when generating digital images. For example, an electrical current from a pixel can be integrated during an integration period, and a generated voltage as a result of the integration can be sampled and used to generate image data for that pixel. This process can be performed for each pixel in an imaging array in order to generate image data for the array.

SUMMARY

This disclosure relates to high flux detection and imaging using capacitor transimpedance amplifier (CTIA)-based unit cells in imaging devices.

In a first embodiment, an apparatus includes a photodetector configured to generate an electrical current based on received illumination. The apparatus also includes a CTIA unit cell configured to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. The apparatus further includes a comparator configured to compare an input voltage of the amplifier and a second reference voltage, where generation of the integration voltage is modifiable based on the comparison.

In a second embodiment, a system includes a focal plane array having multiple pixel circuit elements. Each pixel circuit element includes a photodetector configured to generate an electrical current based on received illumination. Each pixel circuit element also includes a CTIA unit cell configured to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. Each pixel circuit element further includes a comparator configured to compare an input voltage of the amplifier and a second reference voltage, where generation of the integration voltage is modifiable based on the comparison.

In a third embodiment, a method includes generating an electrical current based on received illumination using a photodetector. The method also includes integrating the electrical current using a CTIA unit cell to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. The method further includes comparing an input voltage of the amplifier and a second reference voltage and controlling generation of the integration voltage based on the comparison.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIGS. 2A through 2C illustrate a first example circuit supporting high flux detection and imaging in a CTIA-based unit cell of an imaging device and related details according to this disclosure;

DETAILED DESCRIPTION

Figure 1:
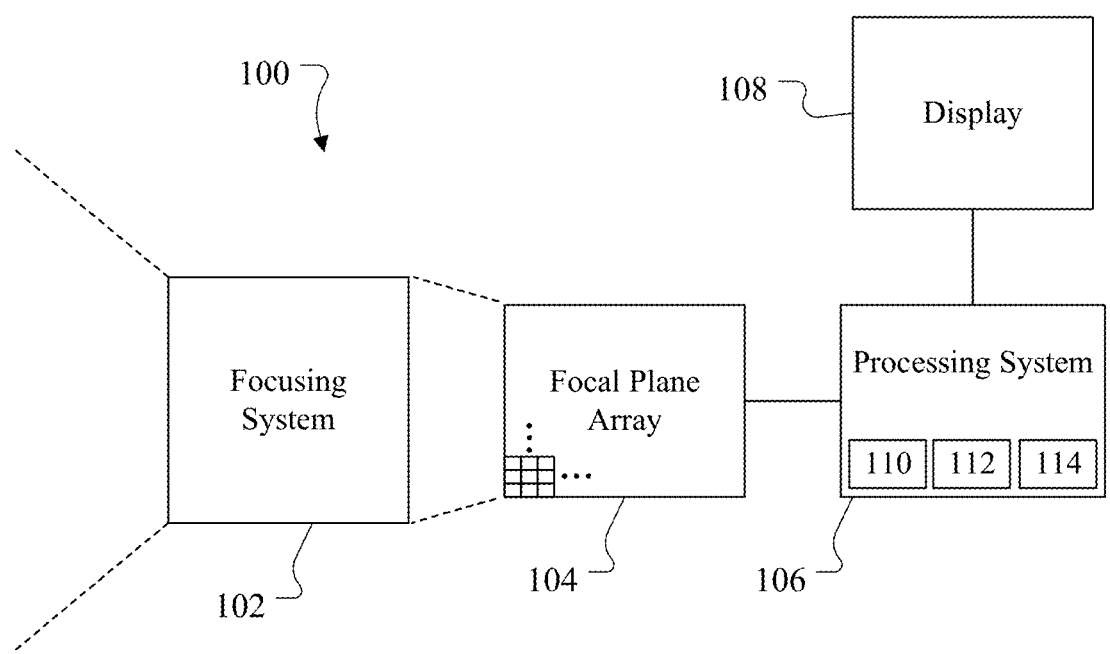
FIG. 1 illustrates an example system supporting high flux detection and imaging using capacitor transimpedance amplifier (CTIA)-based unit cells in an imaging device according to this disclosure.

FIGS. 1 through 10, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, digital imaging systems often use integrators to capture information when generating digital images. For example, an electrical current from a pixel can be integrated during an integration period, and a generated voltage as a result of the integration can be sampled and used to generate image data for that pixel. This process can be performed for each pixel in an imaging array in order to generate image data for the array.

One issue that can affect digital imaging systems in some applications is the presence of high fluxes. For example, if a scene being imaged includes a high flux source (such as the sun or a bright manmade light source), the high flux can cause amplifiers used in various pixel circuits to saturate. If this saturation occurs quickly before other actions occur within the pixel circuits, the pixel circuits can actually generate low outputs rather than high outputs. This leads to the creation of artifacts within captured images, such as "dark sun" or "black sun" artifacts where the sun or other light source appears as a black sun or other dark object within the captured images. Some prior approaches attempt to use fast frame/line rates to isolate fast bright pulses to specific data samples and then filter the pulses after data has been gathered. Other approaches may filter data generated by some pixels using data from neighboring pixels or may use different types of pixel circuits that are less sensitive. However, these approaches typically result in decreased sensitivity, which lowers the image quality of the generated images.

This disclosure provides circuits that support high flux detection and imaging using capacitor transimpedance amplifier (CTIA)-based unit cells in imaging devices. As described in more detail below, each of multiple pixel circuit elements in an imaging device may include a photodiode or other pixel and a CTIA unit cell that integrates an electrical current produced by the associated pixel. Each CTIA unit cell may include a transimpedance amplifier that is used to generate an integration voltage (such as directly or using a coupling capacitor). The integration voltage may be buffered and provided as an output from the corresponding pixel circuit element. In some cases, a clamp may include a clamp switch that can be used to selectively hold the integration voltage at a desired voltage level at specified times, such as at the beginning of an integration period. Also, in some cases, a bypass switch may be used to selectively bypass the coupling capacitor so that a pre-integration voltage can be provided as the integration voltage.

An additional comparator in each pixel circuit element can be used to compare an input voltage of the amplifier in the associated CTIA unit cell to a threshold. This approach relies on the non-ideality associated with the CTIA unit cell to detect high flux events. When the amplifier in a CTIA unit cell cannot supply enough current to its feedback element (due to excessive electrical current being produced by the associated pixel in response to a high flux event), a higher integrated voltage is produced by the amplifier at its input. As a result, the additional comparator can be used to sense if there is a high flux event impacting operation of the CTIA unit cell by detecting a spike in the amplifier's input voltage. When a high flux event is detected, the additional comparator can generate an output indicating that the high flux event has been detected. At that point, a feedback mechanism allows corrective action to occur in order to help mitigate the effects of the high flux event. For instance, in some cases, the bypass switch can be closed and the clamp switch can be opened in order to ensure that an appropriate integration voltage is generated and used to produce the output of the pixel circuit element. In other cases, a current supplied to the amplifier of the CTIA unit cell may be increased, a larger feedback capacitor may be switched into the CTIA unit cell, or other corrective action(s) may occur. A combination of corrective actions may also occur, such as when the current supplied to the amplifier of the CTIA unit cell is increased and the larger feedback capacitor is switched into the CTIA unit cell.

In this way, the pixel circuit elements are able to dynamically adjust the integration mode being used to integrate electrical currents within the pixel circuit elements. As a result, each pixel circuit element is able to more accurately produce output values in the presence of high flux within a scene being imaged. This can help to reduce the creation of artifacts in the images of the scene or help overcome other issues affecting the imaging of the scene. This can also help to increase the dynamic range of captured images and provide lower read noise floors for the pixel circuit elements. Further, this can be performed independently for each pixel circuit element, so pixel circuit elements that are unaffected by high flux may operate normally while pixel circuit elements affected by high flux can take corrective action(s). Moreover, this approach can be used to detect both static and dynamic high flux sources, and the detection may occur throughout an imaging timeline (including prior to integration, during integration and prior to clamp release, during integration and after clamp release, or after integration). In addition, the detection of high flux may be accomplished using techniques performed "on chip," meaning integrated circuit chips used to generate captured images in some embodiments can also be used to perform the described high flux detection and imaging techniques.

Imaging systems designed in accordance with this disclosure may be used in any suitable applications. For example, imaging systems designed in accordance with this disclosure may be used in digital cameras, video recorders, smartphones, or other electronic devices that can be used to capture still or video images. Imaging systems designed in accordance with this disclosure may be used in commercial and defense-related satellites, aircraft, and drones, such as to produce visible, infrared, or other images of scenes. Imaging systems designed in accordance with this disclosure may be used in robotic systems or other systems intended for use in surgical or industrial settings, such as to generate images of patients undergoing treatment or images of components being fabricated or processed using lasers or other electromagnetic energy. Imaging systems designed in accordance with this disclosure may be used in medical imaging systems, such as to produce images of patients in the presence of x-rays or other electromagnetic energy. In general, the imaging systems designed in accordance with this disclosure may be used in any suitable applications where high fluxes may otherwise interfere with proper operation of the imaging systems.

FIG. 1 illustrates an example system 100 supporting high flux detection and imaging using capacitor transimpedance amplifier (CTIA)-based unit cells in an imaging device according to this disclosure. As shown in FIG. 1, the system 100 includes a focusing system 102, a focal plane array 104, and a processing system 106. The focusing system 102 generally operates to focus illumination from a scene onto the focal plane array 104. The focusing system 102 may have any suitable field of view that is directed onto the focal plane array 104. The focusing system 102 includes any suitable structure(s) configured to focus illumination, such as one or more lenses, mirrors, or other optical devices.

The focal plane array 104 generally operates to capture image data related to a scene. For example, the focal plane array 104 may include a matrix or other collection of pixel circuit elements that generate electrical signals representing a scene and that process the electrical signals. Several of the pixel circuit elements are shown in FIG. 1, although the size of the pixel circuit elements is exaggerated for convenience here. The focal plane array 104 may capture image data in any suitable spectrum or spectra, such as in the visible, infrared, or ultraviolet spectrum. The focal plane array 104 may also have any suitable resolution, such as when the focal plane array 104 includes a collection of approximately 1,000 pixel circuit elements by approximately 1,000 pixel circuit elements (although other collection sizes may be used). The focal plane array 104 includes any suitable collection of pixel circuit elements configured to capture image data. The focal plane array 104 may also include additional components that facilitate the receipt and output of information, such as readout integrated circuits (ROICs).

As described in more detail below, the pixel circuit elements of the focal plane array 104 include pixels (such as photodiodes) that capture illumination from a scene and generate electrical currents. For each pixel circuit element, the electrical current of the associated pixel can be integrated using a CTIA unit cell in order to generate an integration voltage. Each pixel circuit element of the focal plane array 104 also includes an additional comparator that compares an input voltage of an amplifier in the CTIA unit cell to a threshold, which can be done to identify the presence of high flux in the scene. The output of the additional comparator can be used to control how the pixel circuit element generates the integration voltage in order to compensate for the presence of the high flux in the scene, thereby helping to mitigate the effects of the high flux.

The processing system 106 receives outputs from the focal plane array 104 and processes the information. For example, the processing system 106 may process image data generated by the focal plane array 104 in order to generate visual images for presentation to one or more personnel, such as on a display 108. However, the processing system 106 may use the image data generated by the focal plane array 104 in any other suitable manner. The processing system 106 includes any suitable structure configured to process information from a focal plane array or other imaging system. For instance, the processing system 106 may include one or more processing devices 110, such as one or more microprocessors, microcontrollers, digital signal processors, field programmable gate arrays, application specific integrated circuits, or discrete logic devices. The processing system 106 may also include one or more memories 112, such as a random access memory, read only memory, hard drive, Flash memory, optical disc, or other suitable volatile or non-volatile storage device(s). The processing system 106 may further include one or more interfaces 114 that support communications with other systems or devices, such as a network interface card or a wireless transceiver facilitating communications over a wired or wireless network or a direct connection. The display 108 includes any suitable device configured to graphically present information.

Although FIG. 1 illustrates one example of a system 100 supporting high flux detection and imaging using CTIA-based unit cells in an imaging device, various changes may be made to FIG. 1. For example, various components in FIG. 1 may be combined, further subdivided, replicated, omitted, or rearranged and additional components may be added according to particular needs. Also, FIG. 1 illustrates one example type of system in which high flux detection and imaging may be used by an imaging device. However, the functionality for high flux detection and imaging may be used in any other suitable device or system.

FIGS. 2A through 2C illustrate a first example circuit 200 supporting high flux detection and imaging in a CTIA-based unit cell of an imaging device and related details according to this disclosure. An instance of the circuit 200 shown in FIG. 2A may, for example, represent (or be used as at least part of) each pixel circuit element of the focal plane array 104 in the system 100 shown in FIG. 1. Thus, different pixel circuit elements of the focal plane array 104 may include different instances of the circuit 200 shown in FIG. 2A. However, any number of the circuits 200 may be used with any other suitable device and in any other suitable system.

As shown in FIG. 2A, the circuit 200 includes a pixel in the form of a photodetector 202, which generally operates to produce an electrical current based on received illumination. The photodetector 202 includes any suitable structure configured to generate an electrical current based on received illumination, such as a photodiode. In some cases, the photodetector 202 may represent a photodiode or other structure that can sense illumination in a specified wavelength range or band, such as in the visible, infrared, or ultraviolet spectrum. The photodetector 202 here is coupled to receive a detector voltage $V_{Det}$, which may be provided by any suitable voltage source.

The electrical current generated by the photodetector 202 is provided to an amplifier 204, and a feedback capacitor 206 and a reset switch 208 are coupled in parallel across the amplifier 204 (meaning the feedback capacitor 206 and the reset switch 208 are each coupled to the input and the output of the amplifier 204). The amplifier 204 in this example is arranged as an inverting amplifier that receives the electrical current generated by the photodetector 202 on an inverting input terminal and that receives a first reference voltage $V_{Ref1}$ (which may be provided by any suitable voltage source) on a non-inverting input terminal. An output generated by the amplifier 204 can be proportional to a product of the electrical current generated by the photodetector 202 and the integration or sampling time and can be inversely proportional to the value of the feedback capacitor 206. The output from the amplifier 204 here is used to charge the feedback capacitor 206. The reset switch 208 can be closed prior to an integration period in order to reset the voltage stored on the feedback capacitor 206, and the reset switch 208 can be opened at the beginning of an integration period in order to allow the feedback capacitor 206 to be charged during the integration period. Effectively, these components form at least part of a CTIA unit cell that converts the electrical current generated by the photodetector 202 into a corresponding voltage during each of one or more integration periods.

In some embodiments, the output of the amplifier 204 represents an integration voltage $V_{Int}$, which may be buffered using a buffer 210 and provided as an output from the corresponding pixel circuit element. In this example, the pixel circuit element may be coupled to a column line 212, which represents an electrical conductor that can be coupled to multiple pixel circuit elements and a readout integrated circuit or other component. Multiplexing or other circuitry can be used to enable outputs from the multiple pixel circuit elements to be obtained over the column line 212. The focal plane array 104 may include any suitable number of column lines 212, each of which may be coupled to any suitable number of pixel circuit elements. Note, however, that the use of column lines 212 is optional, and outputs of the pixel circuit elements may be obtained in any other suitable manner.

In other embodiments, the output of the amplifier 204 represents a pre-integration voltage $V_{IntPre}$, which can be used to charge a coupling capacitor 214 and generate the integration voltage $V_{Int}$. Again, the integration voltage $V_{Int}$ may be buffered using the buffer 210 and provided as an output from the corresponding pixel circuit element, such as via the column line 212. A bypass switch 216 may optionally be coupled in parallel across the coupling capacitor 214 and can be used to selectively bypass the coupling capacitor 214. For example, during non-high flux operation, a clamp switch 218 (described below) is opened, the bypass switch 216 can be opened, and the pre-integration voltage $V_{IntPre}$ can be provided to the coupling capacitor 214 for use in generating the integration voltage $V_{Int}$. During high flux operation, the bypass switch 216 can be closed, and the pre-integration voltage $V_{IntPre}$ can bypass the coupling capacitor 214 and be provided as the integration voltage $V_{Int}$.

A clamp may optionally be used to selectively hold the integration voltage $V_{Int}$ at a desired voltage level at specified times, such as at the beginning of an integration period. The clamp here is formed using the clamp switch 218 that can be used to selectively couple the coupling capacitor 214 and the buffer 210 to a clamp voltage $V_{Clamp}$ (which may be provided by any suitable voltage source). In some cases, the clamp switch 218 can be closed in order to hold the integration voltage $V_{Int}$ at a desired voltage level at the start of an integration period and then opened to allow for integration of the electrical current from the photodetector 202 during the integration period.

The CTIA unit cell shown in FIG. 2A can be used to generate very accurate image data for a scene. In some cases, for instance, the amplifier 204 may use a bias current of only a few nano-amps so that the CTIA unit cell can minimize power while detecting very low electrical currents from the photodetector 202. However, the CTIA unit cell can saturate quickly when the photodetector 202 provides a large electrical current due to high flux. Such a large electrical current can prevent the CTIA unit cell from accurately measuring small changes in the electrical current. As one example, if saturation from a natural or manmade high flux source occurs very quickly at the start of an integration period (before the clamp switch 218 opens), it is possible for the pixel circuit element to produce an incorrect low output signal indicative of low flux, rather than a correct high output signal indicative of high flux. In some cases, this can create a "dark sun" or "black sun" artifact since the resulting image includes dark pixels where very bright pixels should be included.

To help compensate for these types of issue, the circuit 200 here includes a comparator 220 that is coupled to an input of the amplifier 204. The comparator 220 receives an input voltage $V_{In}$ produced at one of the inputs of the amplifier 204 and compares the input voltage $V_{In}$ to a second reference voltage $V_{Ref2}$ (which may be provided by any suitable voltage source). The second reference voltage $V_{Ref2}$ can represent a different voltage than the first reference voltage $V_{Ref1}$. When the comparator 220 determines that the input voltage $V_{In}$ equals or crosses the second reference voltage $V_{Ref2}$, this is indicative of a high flux event, and the comparator 220 can generate a pulse or other detection signal 222. The detection signal 222 indicates that the high flux event has been detected, which allows a controller 224 to take corrective action. In some embodiments, the second reference voltage $V_{Ref2}$ may represent a relatively-high voltage level, and the comparator 220 may detect when the input voltage $V_{In}$ equals or exceeds the second reference voltage $V_{Ref2}$.

As noted above, this approach relies on the non-ideality associated with the CTIA unit cell to detect a high flux event. When the amplifier 204 cannot supply adequate electrical current to the feedback capacitor 206 (due to excessive electrical current being produced by the associated photodetector 202 in response to the high flux event), a higher integrated input voltage $V_{In}$ is produced by the amplifier 204 at its input. This is because the large signal from the photodetector 202 creates a higher offset between the positive and negative nodes of the amplifier 204. Due to the limited output impedance and/or gain of the amplifier 204, the CTIA unit cell cannot equalize its inputs, and the larger input voltage $V_{In}$ is created. As a result, the comparator 220 can be used here to sense if there is a high flux event impacting operation of the CTIA unit cell by detecting a spike in the amplifier's input voltage $V_{In}$.

The controller 224 may be used to control the operations of various components in the circuit 200. For example, the controller 224 may be used to generate one or more drive signals for controlling the state(s) of one or more switches 208, 216, 218 in the circuit 200. The controller 224 can also use various inputs (such as the detection signal 222) when controlling the state of the reset switch 208 and optionally the state(s) of one or both of the switches 216, 218 in the circuit 200. Thus, for instance, during non-high flux operation of some embodiments of the circuit 200, the controller 224 may keep the bypass switch 216 opened so that there is no bypass around the coupling capacitor 214. The controller 224 can close the switches 208 and 218 to reset the CTIA unit cell, and the controller 224 can open the reset switch 208 at the beginning of an integration period. Shortly after the beginning of the integration period, the controller 224 can open the clamp switch 218 and allow the integration voltage $V_{Int}$ to be generated and used to produce an output of the circuit 200. The controller 224 can close the switches 208 and 218 to reset the CTIA unit cell again, and the controller 224 can open the reset switch 208 at the beginning of the next integration period and repeat the same process.

During high flux operation of some embodiments of the circuit 200, the controller 224 may initially have the bypass switch 216 opened so that there is no bypass around the coupling capacitor 214. The controller 224 can close the switches 208 and 218 to reset the CTIA unit cell, and the controller 224 can open the reset switch 208 at the beginning of an integration period. However, at some point (possibly prior to the normal opening of the clamp switch 218), the comparator 220 may determine that the CTIA unit cell may saturate based on the input voltage $V_{In}$ and the second reference voltage $V_{Ref2}$, and the controller 224 (based on the resulting detection signal 222) can open the clamp switch 218 and close the bypass switch 216 to provide the bypass around the coupling capacitor 214. As a result, the pre-integration voltage $V_{IntPre}$ can be used as the integration voltage $V_{Int}$ when generating an output from the circuit 200, which allows the saturation voltage level to be applied as the integration voltage $V_{Int}$ during this time.

One example of these types of operations in shown in FIGS. 2B and 2C. In FIG. 2B, during non-high flux operation, the amplifier's input voltage $V_{In}$ can generally remain below the second reference voltage $V_{Ref2}$, so the detection signal 222 remains low as shown in a plot 250. While the amplifier's input voltage $V_{In}$ here is shown as being generally constant, some variations in the amplifier's input voltage $V_{In}$ may occur (although the input voltage $V_{In}$ can remain below the second reference voltage $V_{Ref2}$). In FIG. 2C, during high flux operation, the amplifier's input voltage $V_{In}$ increases and eventually equals or exceeds the second reference voltage $V_{Ref2}$ as shown in a plot 252. At that point, the comparator 220 toggles its output so that the detection signal 222 becomes high. The high value of the detection signal 222 can be detected by the controller 224 and used to initiate corrective action as described below.

Effectively, the detection signal 222 is being used to support a feedback mechanism that allows corrective action to be taken when a high flux event is detected. In some embodiments, this can be done during integration after an integration period has begun and before or coincident with the clamp switch 218 being opened (and before imaging has occurred). This can help to mitigate the effects of the high flux event and reduce the likelihood of creating "dark sun"

or "black sun" artifacts in a captured image. As described below, other implementations of the circuit 200 can be used to take other corrective actions that modify the operation of the circuit 200 based on the presence of absence of a high flux event. Various ones of these other corrective actions need not involve changing the state(s) of the bypass switch 216 or the clamp switch 218. Also, the detection of a high flux event may occur at any suitable times, such as prior to integration, during integration and prior to clamp release, during integration and after clamp release, or after integration.

The amplifier 204 includes any suitable structure configured to generate an amplified output based on an input electrical current. Each capacitor 206, 214 includes any suitable capacitive structure having any suitable capacitance. Each switch 208, 216, 218 includes any suitable structure configured to selectively form and break an electrical connection, such as a transistor. The buffer 210 includes any suitable structure configured to receive and output an electrical voltage. The comparator 220 includes any suitable structure configured to receive and compare multiple electrical voltages. The controller 224 includes any suitable structure configured to control operation of one or more components of the circuit 200. For example, the controller 224 may represent at least one microprocessor, microcontroller, digital signal processor (DSP), field programmable gate array (FPGA), application-specific integrated circuit (ASIC), logic gates, or discrete circuitry. Note that the same controller 224 may or may not be used to control components in different or all instances of the circuit 200.

Although FIGS. 2A through 2C illustrate a first example of a circuit 200 supporting high flux detection and imaging in a CTIA-based unit cell of an imaging device and related details, various changes may be made to FIGS. 2A through 2C. For example, any additional components may be used with the circuit 200 to support other desired functions. Also, the voltages shown in FIGS. 2B and 2C are examples only and merely meant to illustrate example operations of the circuit 200.

Figure 3A:
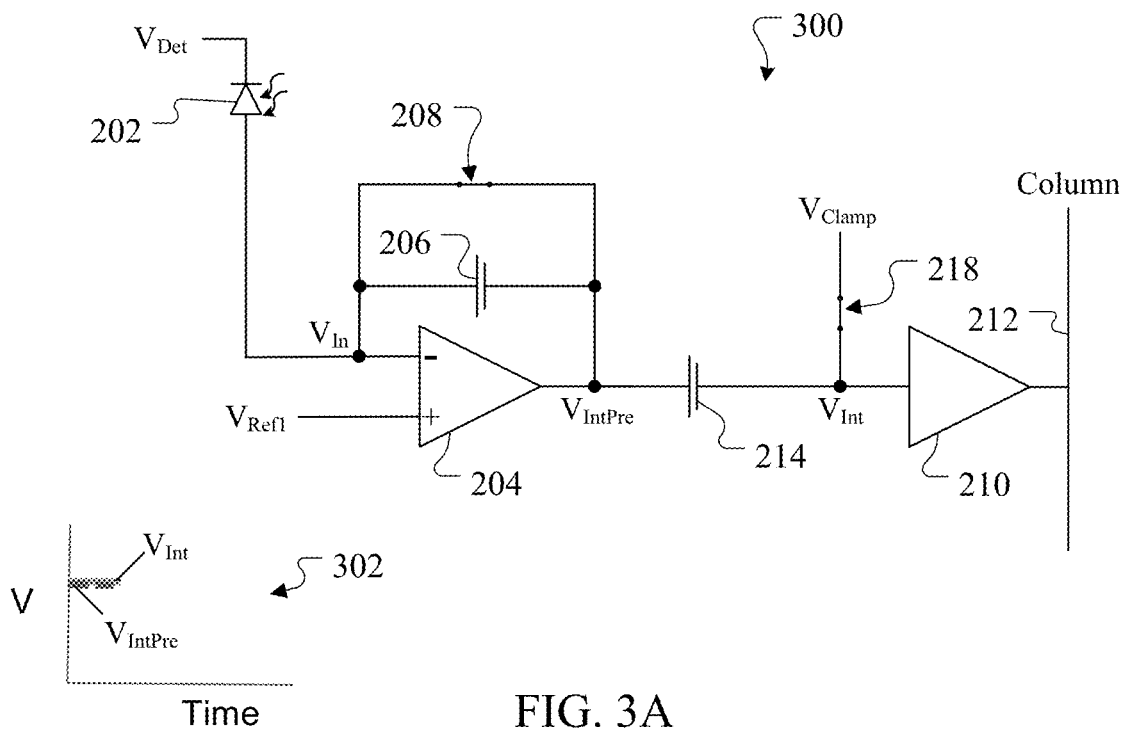
FIGS. 3A through 3D illustrate example operations of a circuit without high flux detection according to this disclosure.

FIGS. 3A through 3D illustrate example operations of a circuit 300 without high flux detection according to this disclosure. In particular, FIGS. 3A through 3D illustrate example operations of a circuit 300 similar to the circuit 200 but without the bypass switch 216 and the comparator 220. In FIG. 3A, the circuit 300 is being reset, so the switches 208 and 218 are closed. This resets the CTIA unit cell and clamps the integration voltage $V_{Int}$ to the clamp voltage $V_{Clamp}$. This also causes the pre-integration voltage $V_{IntPre}$ and the integration voltage $V_{Int}$ to achieve substantially equal values as shown in a plot 302. Note, however, that these voltages do not necessarily need to be close to each other in other embodiments.

Figure 3B:
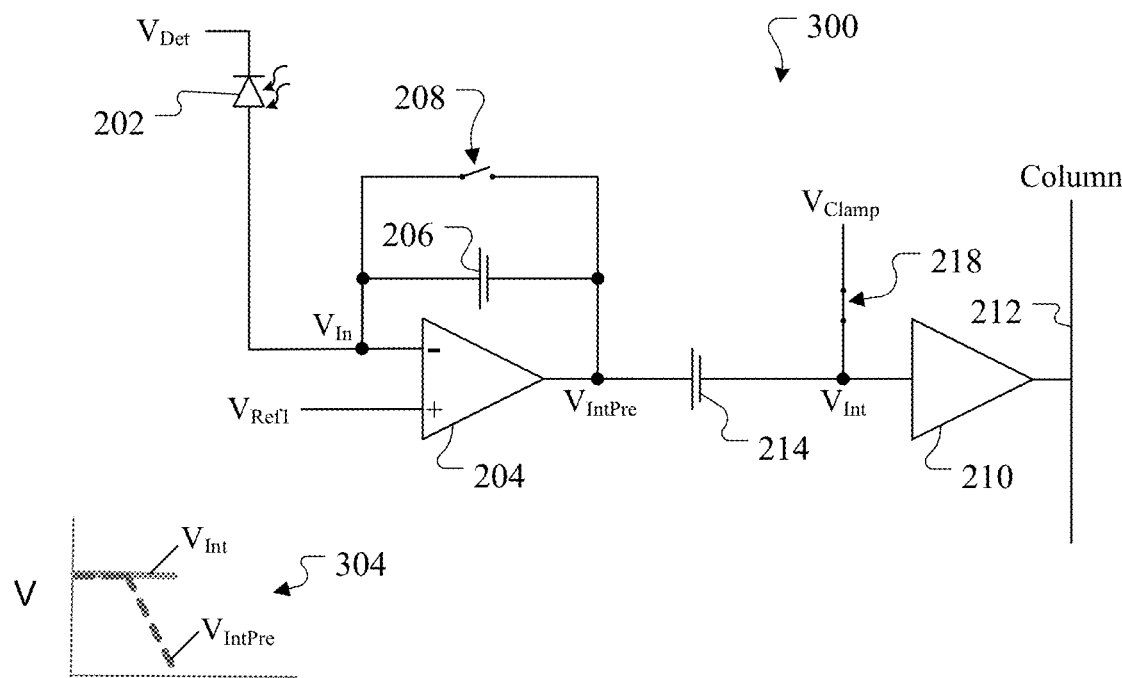

In FIG. 3B, the reset of the circuit 300 is released, so the reset switch 208 is opened, which may occur at the beginning of an integration period. The clamp switch 218 can remain closed at this point. In this configuration, under a high flux condition, the CTIA unit cell quickly saturates. As a result, the pre-integration voltage $V_{IntPre}$ drops due to current from the photodetector 202, while the integration voltage $V_{Int}$ can remain clamped to the clamp voltage $V_{Clamp}$ as shown in a plot 304.

Figure 3C:
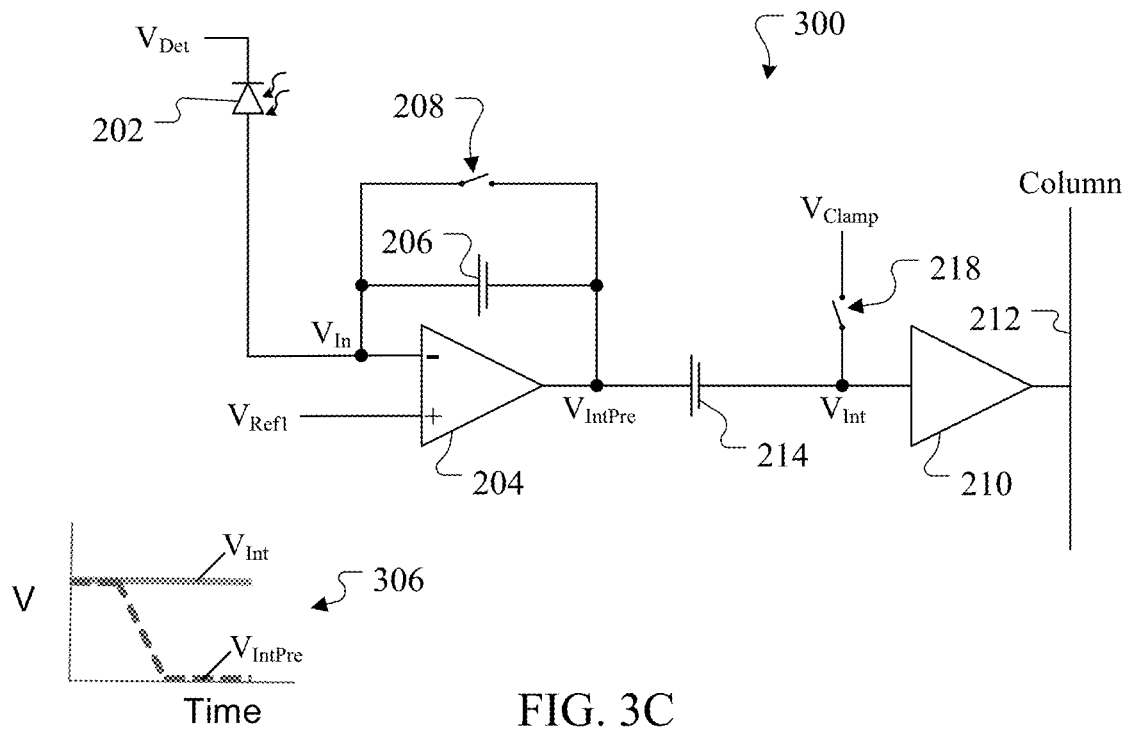
Figure 3D:
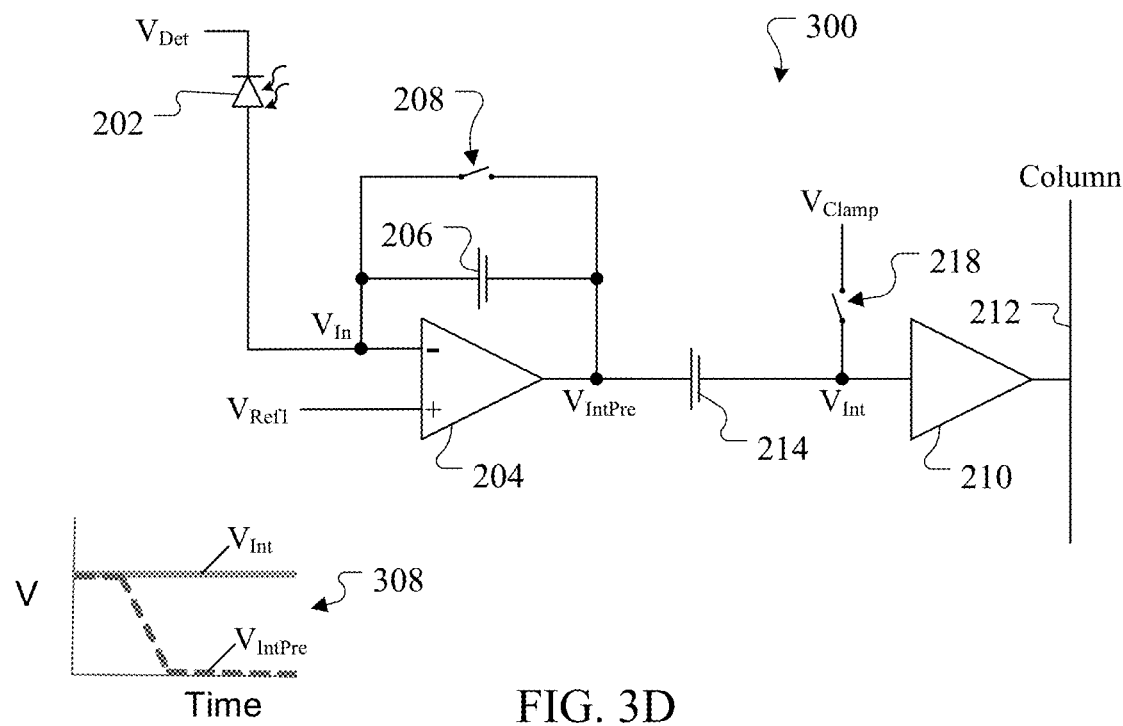

In FIG. 3C, the clamp is released, so the clamp switch 218 is opened. In this configuration, under the high flux condition, the CTIA unit cell has already saturated, so the coupling capacitor 214 will not integrate any further. The result here is that the pre-integration voltage $V_{IntPre}$ levels off at a low voltage level, while the integration voltage $V_{Int}$ remains at a high voltage level as shown in a plot 306. This can continue over time as shown in a plot 308 in FIG. 3D. When the output of the circuit 300 is generated, the integration voltage $V_{Int}$ causes a low light level to be identified, even though a high light level should have been identified due to the high flux condition.

Figure 4A:
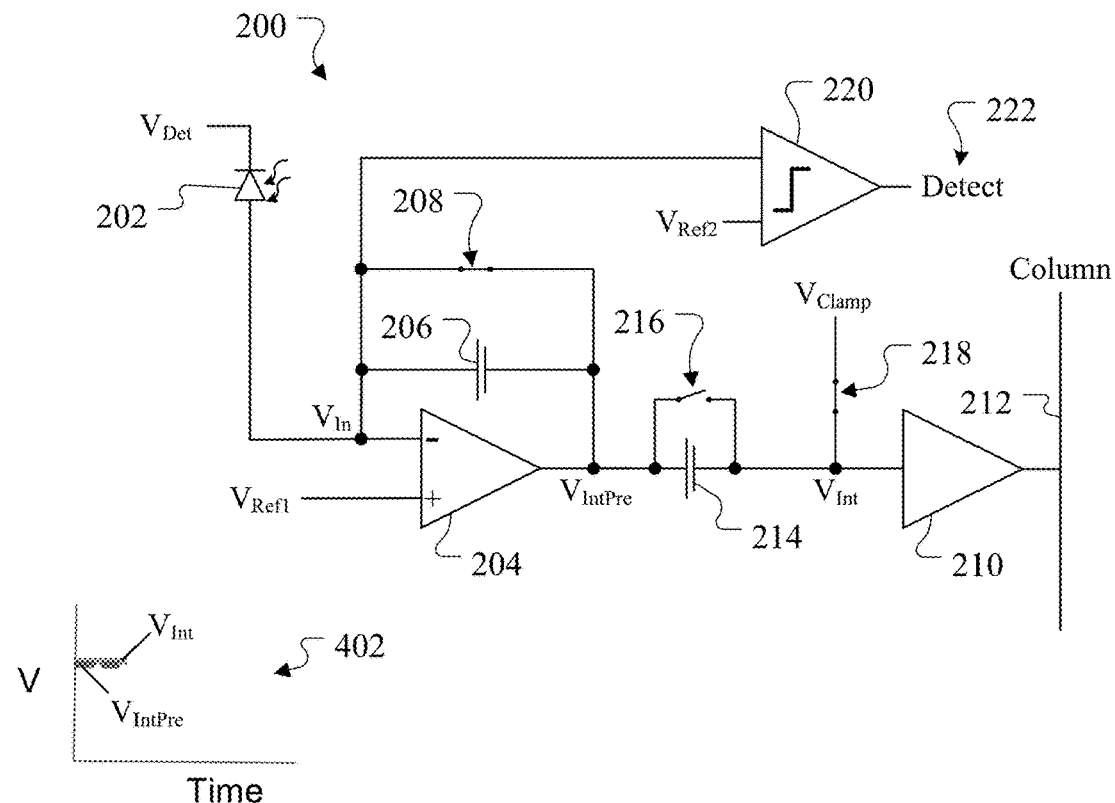
FIGS. 4A through 4D illustrate example operations of the first circuit of FIG. 2A with high flux detection according to this disclosure.

FIGS. 4A through 4D illustrate example operations of the first circuit 200 of FIG. 2A with high flux detection according to this disclosure. In FIG. 4A, the circuit 200 is being reset, so the switches 208 and 218 are closed. A high flux condition has not yet been detected, and the bypass switch 216 is opened. This resets the CTIA unit cell and clamps the integration voltage $V_{Int}$ to the clamp voltage $V_{Clamp}$. This also causes the pre-integration voltage $V_{IntPre}$ and the integration voltage $V_{Int}$ to achieve substantially equal values as shown in a plot 402. Again, note that these voltages do not necessarily need to be close to each other in other embodiments.

Figure 4B:
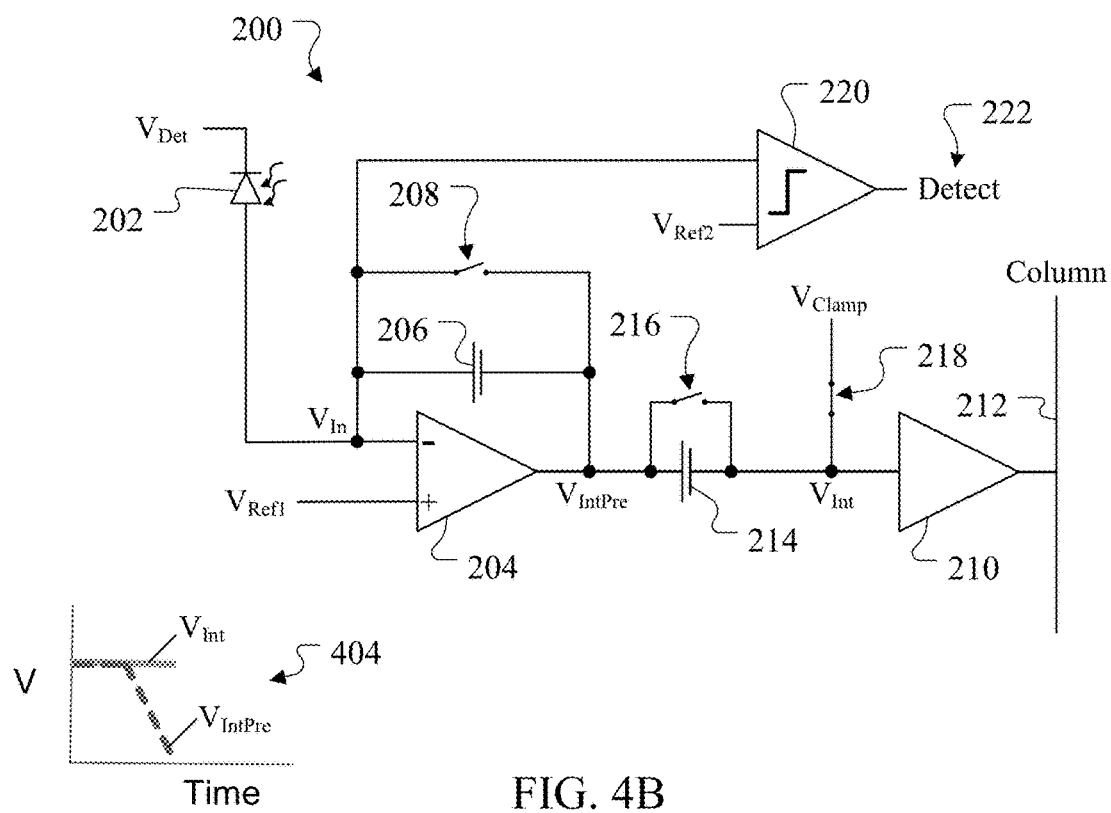

In FIG. 4B, the reset of the circuit 200 is released, so the reset switch 208 is opened, which may occur at the beginning of an integration period. The clamp switch 218 can remain closed, and the bypass switch 216 can remain opened. In this configuration, under a high flux condition, the CTIA unit cell quickly saturates. As a result, the pre-integration voltage $V_{IntPre}$ drops due to current from the photodetector 202, while the integration voltage $V_{Int}$ can remain clamped to the clamp voltage $V_{Clamp}$ as shown in a plot 404. As a result of the pre-integration voltage $V_{IntPre}$ dropping, the input voltage $V_{In}$ increases, such as in the manner shown in the plot 252.

Figure 4C:
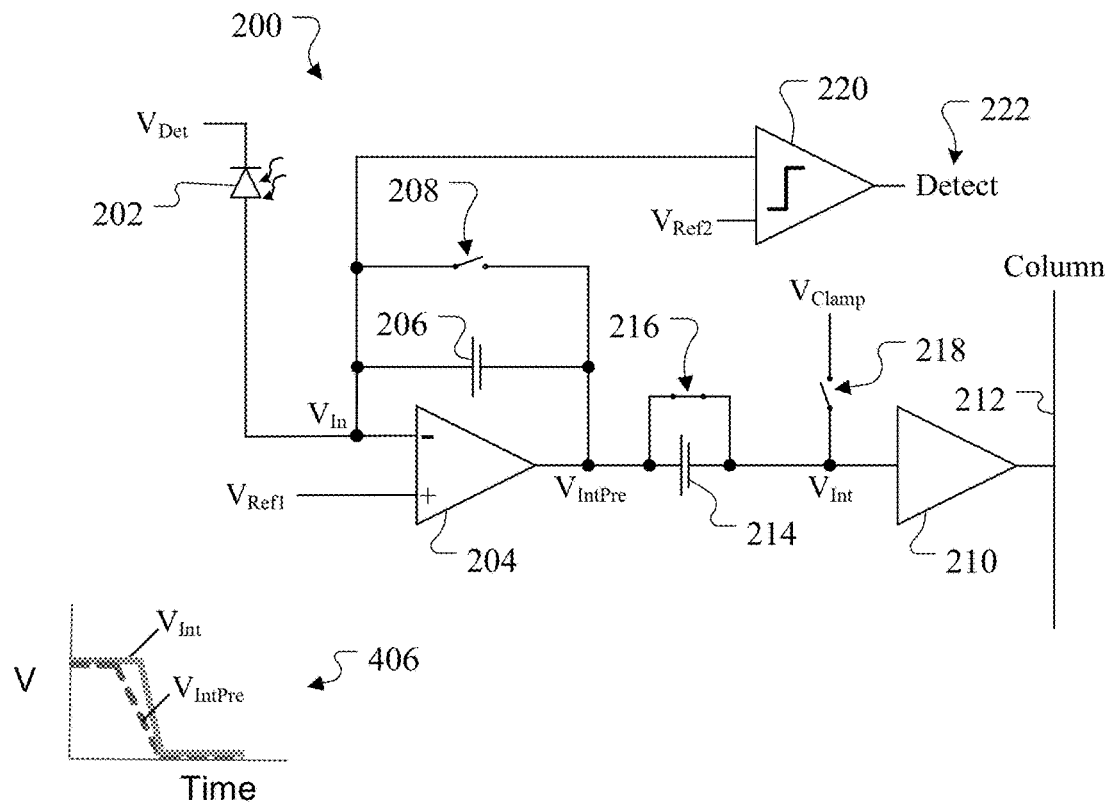
Figure 4D:
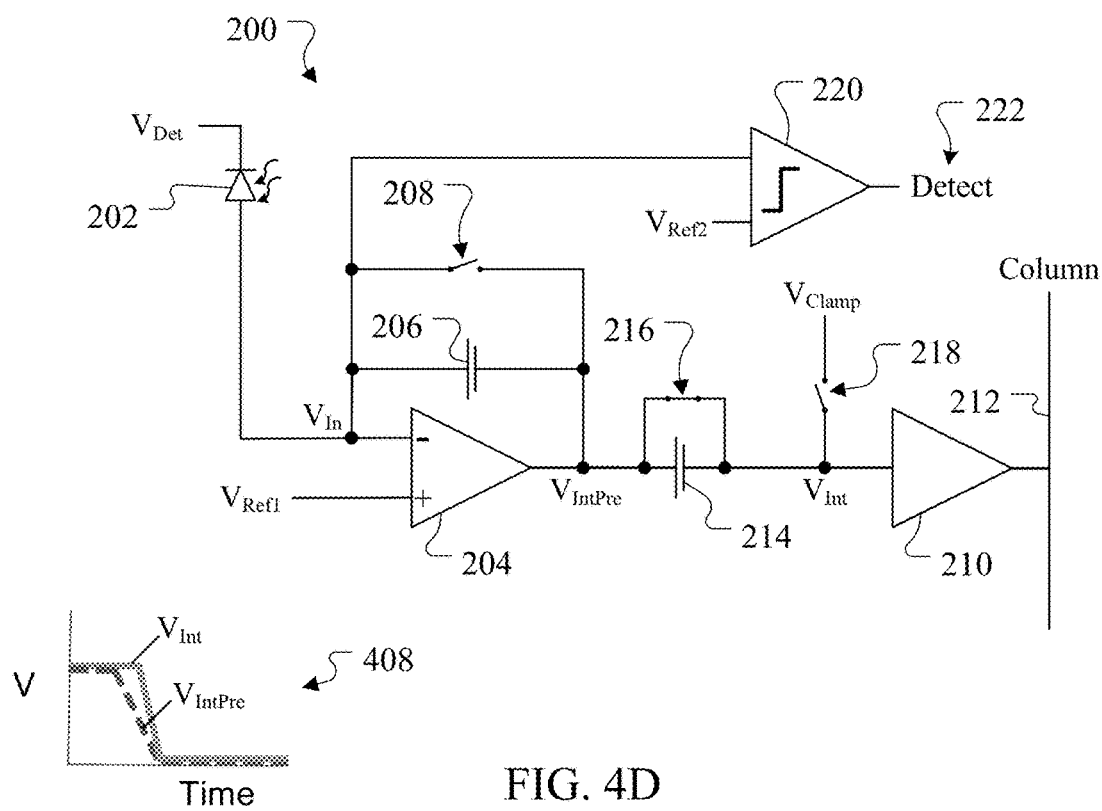

In FIG. 4C, the comparator 220 detects the high flux condition by sensing the saturation of the CTIA unit cell since the input voltage $V_{In}$ equals or exceeds the second reference voltage $V_{Ref2}$. As a result, the comparator 220 generates the detection signal 222 to indicate a high flux event. In response to the detection signal 222, the bypass switch 216 is closed, and the clamp switch 218 is opened. This causes the integration voltage $V_{Int}$ to rapidly change and become substantially equal to the pre-integration voltage $V_{IntPre}$ as shown in a plot 406. This can continue over time as shown in a plot 408 in FIG. 4D. When the output of the circuit 200 is generated, the integration voltage $V_{Int}$ causes a high light level to be identified, which is more consistent with the presence of the high flux condition.

Although FIGS. 3A through 3D illustrate one example of operations of a circuit 300 without high flux detection and FIGS. 4A through 4D illustrate one example of operations of the first circuit 200 of FIG. 2A with high flux detection, various changes may be made to FIGS. 3A through 4D. For example, while the plots 302-308, 402-408 may appear to indicate that the integration voltage $V_{Int}$ is slightly higher than the pre-integration voltage $V_{IntPre}$ at various times, this is done merely to provide adequate separation between lines in the plots 302-308, 402-408 so that different lines can be distinguished in the plots 302-308, 402-408. Also, the pre-integration voltage $V_{IntPre}$ and the clamp voltage $V_{Clamp}$ may represent substantially the same voltage or substantially different voltages depending on design constraints and other parameters.

In the example of FIGS. 4A through 4D above, the circuit 200 uses the output of the comparator 220 as part of a feedback mechanism to control the bypass switch 216 and the clamp switch 218. In some cases, this can help to reduce or avoid the creation of artifacts in captured images by selectively allowing the pre-integration voltage $V_{In}$ to be used as the integration voltage $V_{Int}$. However, there are various other corrective actions that may be triggered using the detection signal 222. For example, other corrective actions may include switching another capacitor into the feedback loop of the amplifier 204 in order to capture additional charge from the photodetector 202 or increasing the amplifier current used by the amplifier 204 in order to image a brighter scene or portion thereof. Other corrective actions may also include closing an additional switch coupled to the input of the buffer 210 and a saturation voltage source, where closing the additional switch pulls the integration voltage $V_{Int}$ to a saturation voltage that can be used to produce the output of the circuit 200 while the CTIA unit cell is saturated. Other corrective actions may further include disabling a correlated double sampling (CDS) function or reading a pre-CDS voltage level. In addition, other corrective actions may include generating a notification of the high flux event for one or more users, such as when a notification is generated and presented on one or more displays 108. The following provide examples of how some of these corrective actions may be implemented. However, the detection signal 222 may be used in any other suitable manner, and the descriptions above and below do not limit the scope of this disclosure to any particular uses of the detection signal 222.

Figure 5A:
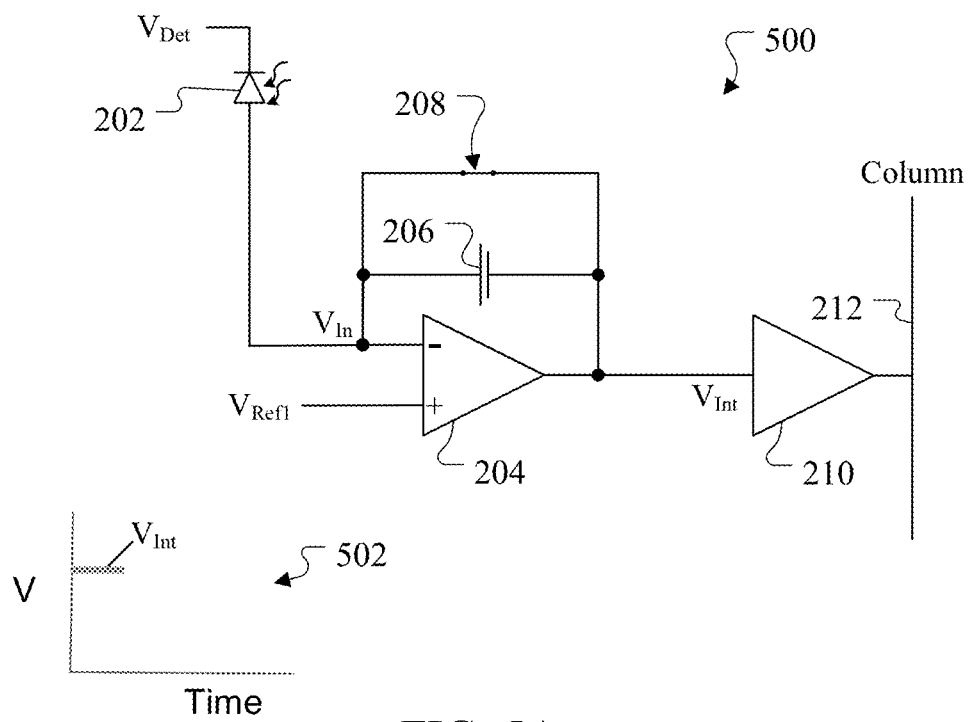
FIGS. 5A and 5B illustrate example operations of another circuit without high flux detection according to this disclosure.
Figure 5B:
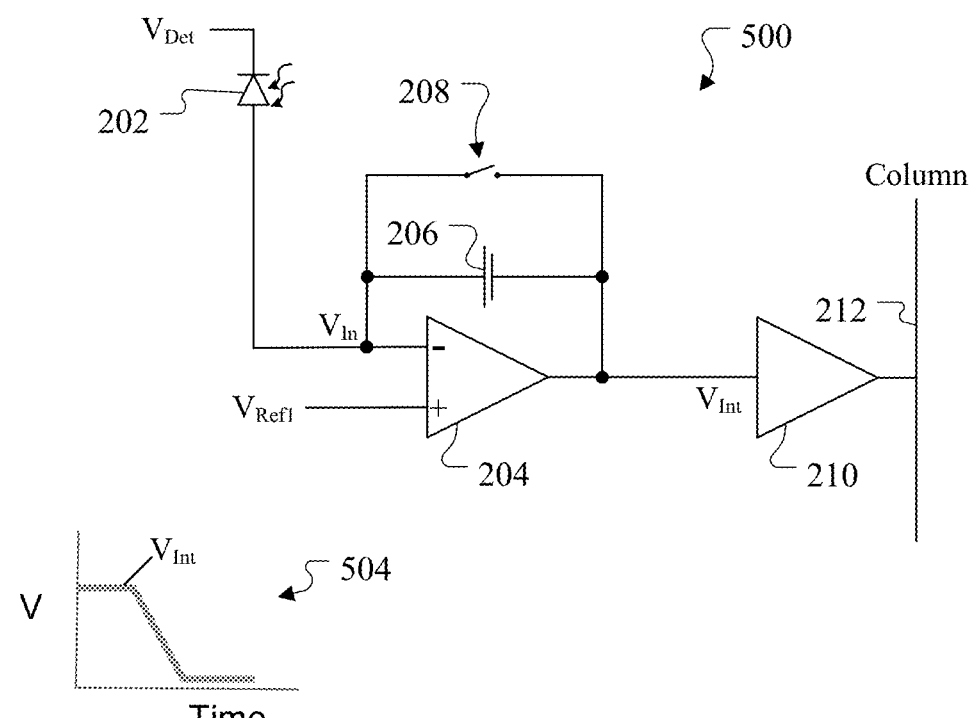

FIGS. 5A and 5B illustrate example operations of another circuit 500 without high flux detection according to this disclosure. In particular, FIGS. 5A and 5B illustrate example operations of a circuit 500 similar to the circuit 200 but without the coupling capacitor 214, bypass switch 216, clamp switch 218, and comparator 220. In FIG. 5A, the circuit 500 is being reset, so the switch 208 is closed. This resets the CTIA unit cell and causes the integration voltage $V_{Int}$ to achieve a relatively-high voltage level as shown in a plot 502. In FIG. 5B, the reset of the circuit 500 is released, so the reset switch 208 is opened, which may occur at the beginning of an integration period. In this configuration, under a high flux condition, the CTIA unit cell quickly saturates, and the integration voltage $V_{Int}$ can drop rapidly and settle at a low voltage level as shown in a plot 504.

Figure 6A:
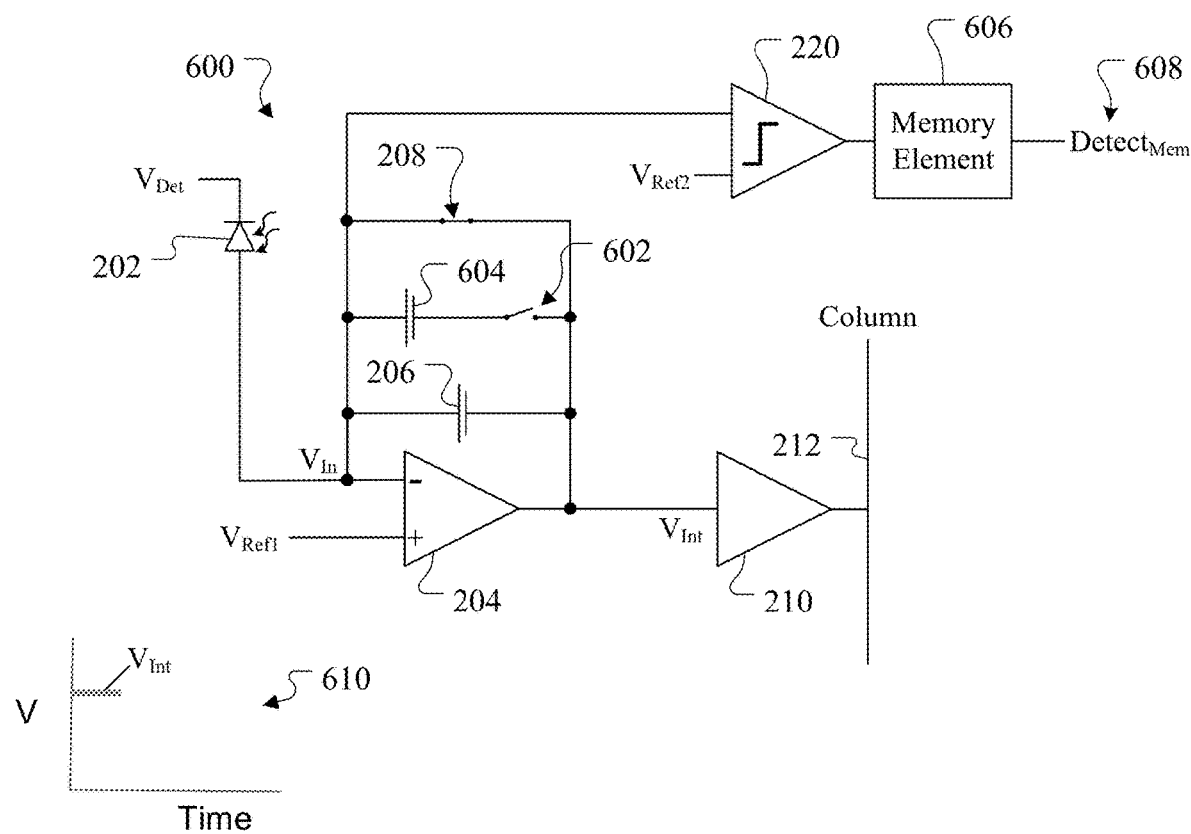
FIGS. 6A and 6B illustrate a second example circuit supporting high flux detection and imaging in a CTIA-based unit cell of an imaging device according to this disclosure.
Figure 6B:
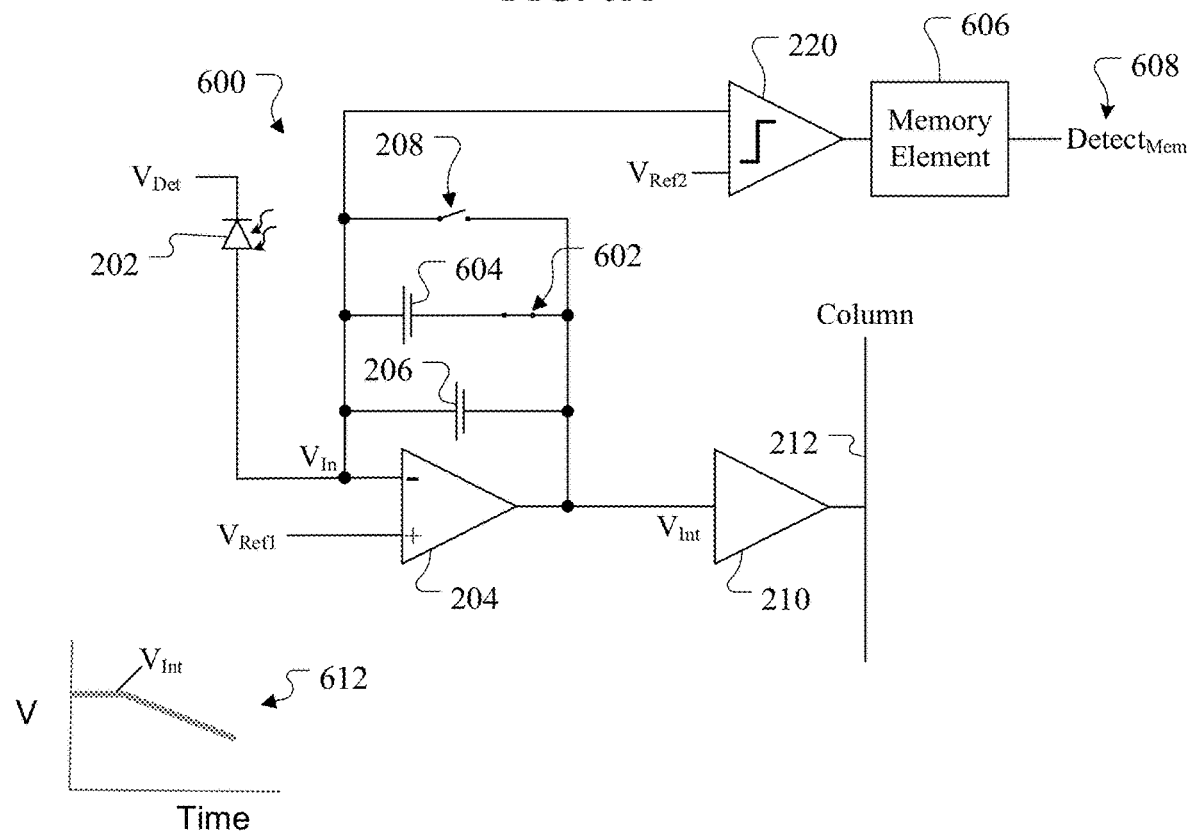

FIGS. 6A and 6B illustrate a second example circuit 600 supporting high flux detection and imaging in a CTIA-based unit cell of an imaging device according to this disclosure. The circuit 600 is similar to the circuit 200 described above, and various components described above with respect to the circuit 200 are included in the circuit 600. However, the circuit 600 again lacks the coupling capacitor 214, bypass switch 216, and clamp switch 218. Moreover, the circuit 600 includes an additional switch 602 and a capacitor 604, which are coupled in series with each other and which are coupled in parallel with the capacitor 206. The circuit 600 also includes a memory element 606 (such as a flip-flop) that can at least temporarily hold the state of the output of the comparator 220. The output of the memory element 606 is said to represent a memory detection signal $Detect_{Mem}$ 608, which represents the state of the output of the comparator 220 as held by the memory element 606.

In FIG. 6A, the circuit is being reset, so the switch 208 is closed, and the switch 602 is opened. This resets the CTIA unit cell and causes the integration voltage $V_{Int}$ to achieve a relatively-high voltage level as shown in a plot 610. In FIG. 6B, the reset of the circuit is released, so the reset switch 208 is opened, which may occur at the beginning of an integration period. In this configuration, under a high flux condition, the comparator 220 can sense the increase in the input voltage $V_{In}$ of the amplifier 204, and the resulting memory detection signal $Detect_{Mem}$ 608 as produced by the memory element 606 can be used to control the switch 602 directly or indirectly (such as when the controller 224 may use the memory detection signal $Detect_{Mem}$ 608 to control the state of the switch 602). In whatever manner the memory detection signal $Detect_{Mem}$ 608 is used, the switch 602 can be closed in response to the high flux event in order to insert the capacitor 604 into the feedback path of the amplifier 204. Since the capacitances of multiple parallel capacitors sum to a larger overall capacitance, this allows an additional or larger capacitance to be used to capture an additional or larger electrical charge from the photodetector 202. In this configuration, under the high flux condition, the CTIA unit cell does not saturate, and the integration voltage $V_{Int}$ can drop more slowly without bottoming out at the low voltage level as shown in a plot 612.

Figure 7:
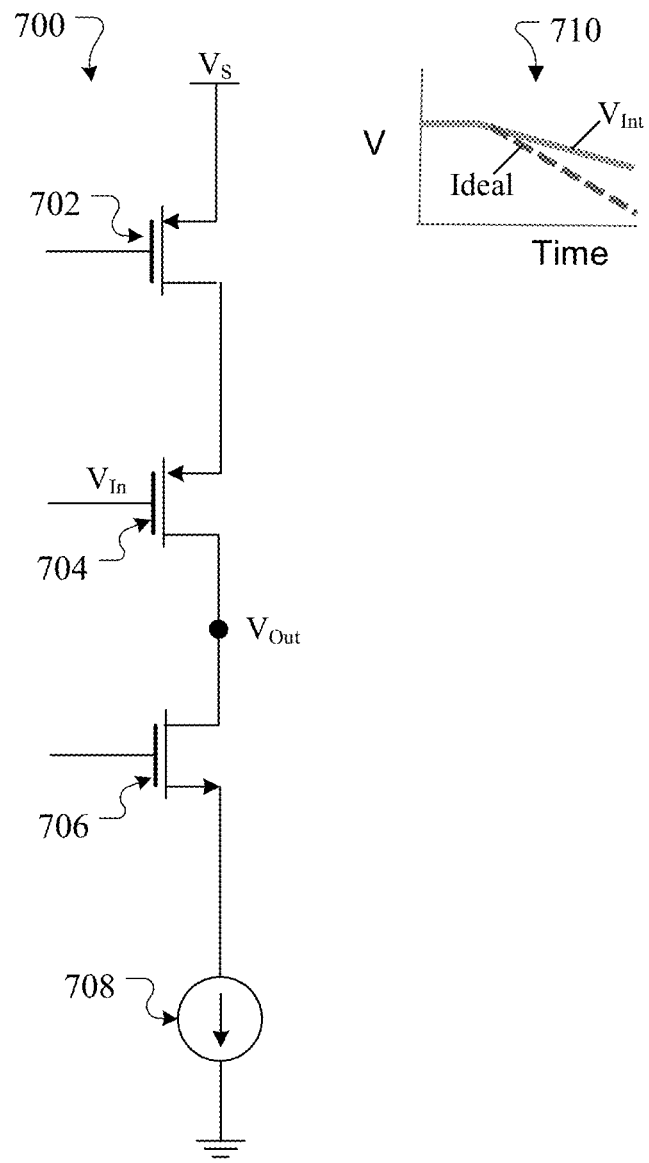
FIG. 7 illustrates example operations of yet another circuit without high flux detection according to this disclosure.

FIG. 7 illustrates example operations of yet another circuit 700 without high flux detection according to this disclosure. In this example, the circuit 700 represents at least a portion of the amplifier 204. Here, the circuit includes three transistors 702, 704, 706 (such as MOSFET transistors) coupled in series with each other and a current source 708. The transistor 702 is configured to receive a supply voltage $V_S$, and the current source 708 is coupled to ground. In this arrangement, a plot 710 illustrates how the integration voltage $V_{Int}$ may drop, but it is shown as having a lower slew rate than desired (due to the bias current from the current source 708 being too low to integrate the high photodetector current).

Figure 8:
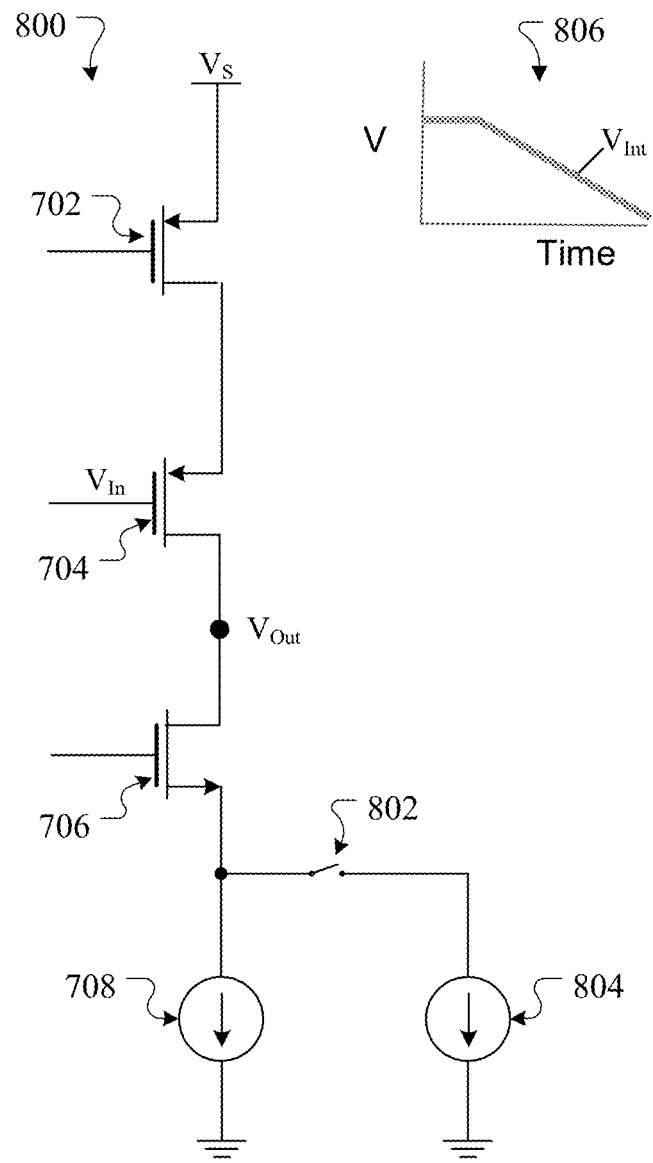
FIG. 8 illustrates a third example circuit supporting high flux detection and imaging in a CTIA-based unit cell of an imaging device according to this disclosure.

FIG. 8 illustrates a third example circuit 800 supporting high flux detection and imaging in a CTIA-based unit cell of an imaging device according to this disclosure. In this example, the circuit 800 includes the same components 702-708 as the circuit 700, plus a switch 802 and another current source 804. The switch 802 can be selectively closed in order to couple the current source 804 in parallel with the current source 708. The switch 802 can be controlled directly or indirectly, such as when the controller 224 may use the detection signal 222 or memory detection signal $Detect_{Mem}$ 608 to control the state of the switch 802. The addition of the current source 804 into the circuit 800 can help to increase the slew rate of the integration voltage $V_{Int}$ as shown in a plot 806. In this case, the slew rate of the integration voltage $V_{Int}$ matches the ideal slew rate much more closely, and the higher slew rate here is created by a high flux event.

Although FIGS. 5A through 8 illustrate examples of other circuits with and without high flux detection, various changes may be made to FIGS. 5A through 8. For example, any additional components may be used with the circuits to support other desired functions. Also, the voltages shown in the various plots are examples only and merely meant to illustrate example operations of the various circuits.

As can be seen here, there are various ways in which the detection signal 222 or its associated memory detection signal $Detect_{Mem}$ 608 can be used to initiate corrective action to counteract a high flux event. While individual approaches are shown in FIGS. 2A through 8 and described above, a combination of corrective actions may also occur if needed or desired, in which case the components used to provide the combination of corrective actions can be combined and used in the same circuit. Also, it will be apparent that the described circuits are able to handle high flux events caused by static and dynamic high flux sources, and the described circuits are able to handle high flux events at various points in an imaging timeline (including prior to integration, during integration and prior to clamp release, during integration and after clamp release, or after integration).

Figure 9:
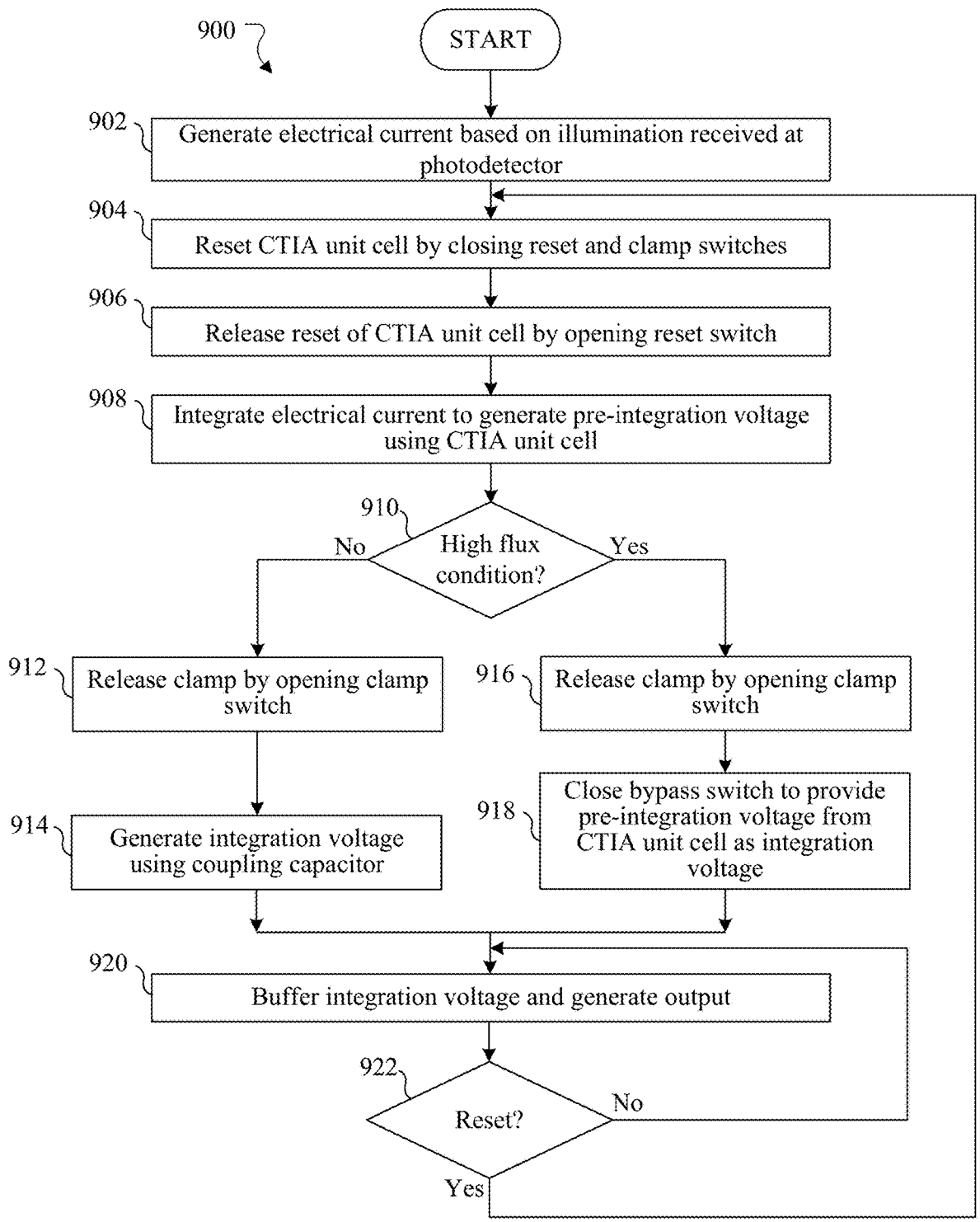
FIG. 9 illustrates an example method for high flux detection and imaging using CTIA-based unit cells in an imaging device according to this disclosure.

FIG. 9 illustrates an example method 900 for high flux detection and imaging using CTIA-based unit cells in an imaging device according to this disclosure. For ease of explanation, the method 900 is described as being performed using the circuit 200 of FIG. 2A in the system 100 of FIG. 1. However, the method 900 may be performed using any other suitable circuit and in any other suitable system.

As shown in FIG. 9, an electrical current is generated based on illumination received at a photodetector at step 902. This may include, for example, the photodetector 202 generating an electrical current based on received illumination. A CTIA unit cell that receives the electrical current is reset at step 904. This may include, for example, the controller 224 closing the reset switch 208 and the clamp switch 218 in the circuit 200. Closing the reset switch 208 resets the voltage on the capacitor 206 of the CTIA unit cell, and closing the clamp switch 218 clamps the integration voltage $V_{Int}$ to the clamp voltage $V_{Clamp}$.

The reset of the CTIA unit cell is released at step 906, and the CTIA unit cell begins integrating the electrical current to generate a pre-integration voltage at step 908. This may include, for example, the controller 224 opening the reset switch 208 so that the amplifier 204 of the CTIA unit cell can generate the pre-integration voltage $V_{IntPre}$ based on the electrical current from the photodetector 202. The release of the reset may, for instance, occur at the beginning of an integration period. At this point, the clamp switch 218 is still closed, thereby clamping the integration voltage $V_{Int}$ to the clamp voltage $V_{Clamp}$.

If there is no high flux condition at step 910, the clamp is released at step 912, and an integration voltage is generated using a coupling capacitor at step 914. This may include, for example, the comparator 220 comparing the input voltage $V_{In}$ and the reference voltage $V_{Ref2}$ and determining that no high flux condition is present based on the comparison. This may also include the controller 224 opening the clamp switch 218 so that the integration voltage $V_{Int}$ is no longer clamped to the clamp voltage $V_{Clamp}$. This may further include the pre-integration voltage $V_{IntPre}$ being provided to the coupling capacitor 214 for use in generating the integration voltage $V_{Int}$. The integration voltage can be buffered and used to generate an output of the circuit at step 920. This may include, for example, the buffer 210 buffering the integration voltage $V_{Int}$ generated using the coupling capacitor 214. This may also include the buffer 210 outputting the buffered signal over the column line 212 or in any other suitable manner.

If there is a high flux condition at step 910, a bypass switch is closed at step 916, and the clamp is released at step 918. This may include, for example, the comparator 220 comparing the input voltage $V_{In}$ and the reference voltage $V_{Ref2}$ and determining that a high flux condition is present based on the comparison. This may also include the controller 224 closing the bypass switch 216 (which is coupled in parallel with the coupling capacitor 214) so that the pre-integration voltage $V_{IntPre}$ is provided as the integration voltage $V_{Int}$. This may further include the controller 224 opening the clamp switch 218 so that the integration voltage $V_{Int}$ (which represents the pre-integration voltage $V_{IntPre}$) is no longer clamped to the clamp voltage $V_{Clamp}$. The integration voltage can be buffered and used to generate the output of the circuit at step 920. This may include, for example, the buffer 210 buffering the integration voltage $V_{Int}$ and outputting the buffered signal over the column line 212 or in any other suitable manner.

A determination is made whether the CTIA unit cell should be reset at step 922. This may include, for example, the controller 224 determining whether the end of the integration period has been reached or whether some other criterion or criteria have been satisfied. If not, the process can continue by buffering the integration voltage $V_{Int}$ that is being generated by the CTIA unit cell. Otherwise, the process can return to step 904 in order to reset the CTIA unit cell.

Figure 10:
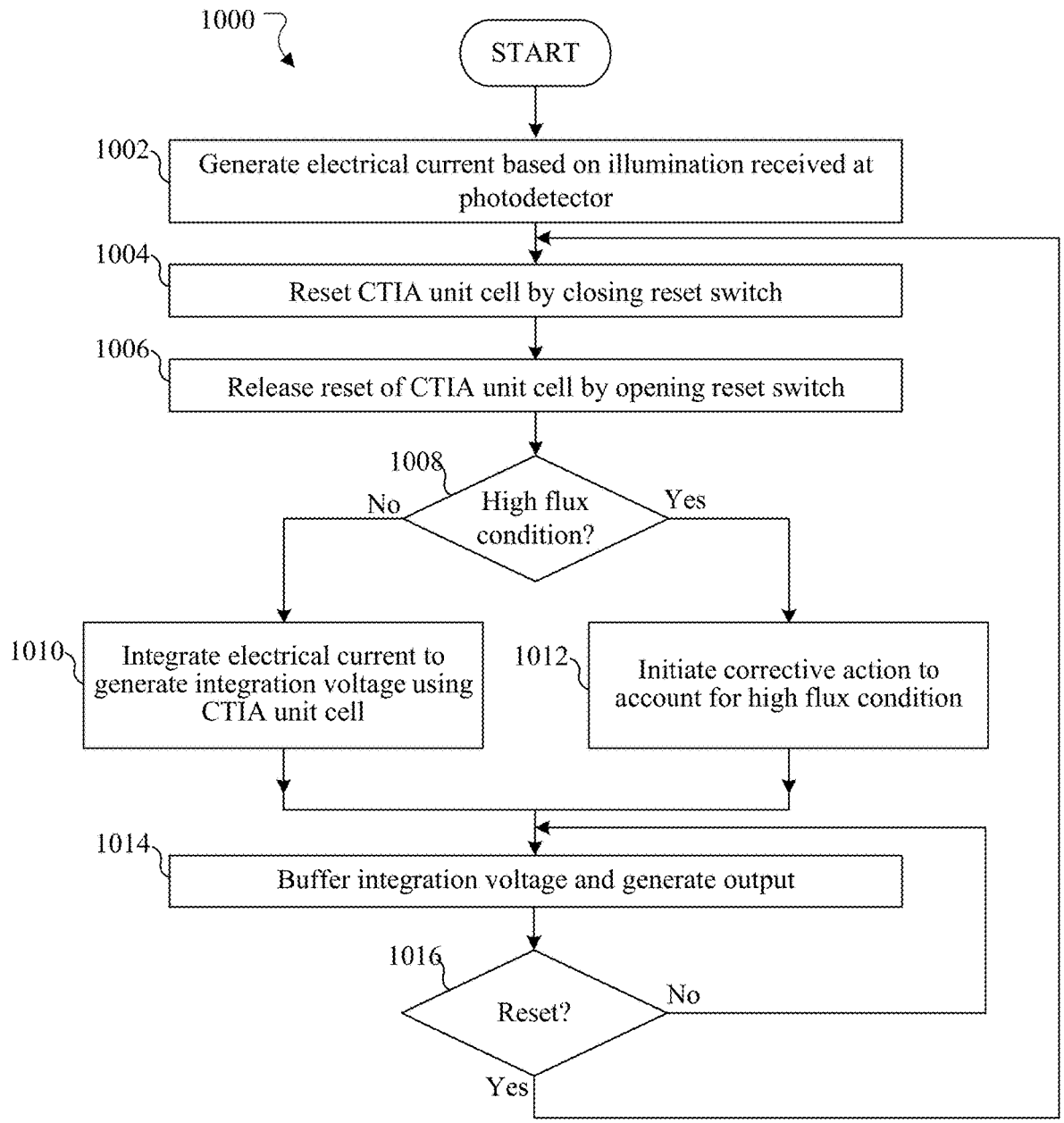
FIG. 10 illustrates another example method for high flux detection and imaging using CTIA-based unit cells in an imaging device according to this disclosure.

FIG. 10 illustrates another example method 1000 for high flux detection and imaging using CTIA-based unit cells in an imaging device according to this disclosure. For ease of explanation, the method 1000 is described as being performed using the circuit 600 of FIGS. 6A and 6B and/or the circuit 800 of FIG. 8 in the system 100 of FIG. 1. However, the method 1000 may be performed using any other suitable circuit (including those described above) and in any other suitable system.

As shown in FIG. 10, an electrical current is generated based on illumination received at a photodetector at step 1002. This may include, for example, the photodetector 202 generating an electrical current based on received illumination. A CTIA unit cell that receives the electrical current is reset at step 1004. This may include, for example, the controller 224 closing the reset switch 208 in the circuit 200, where closing the reset switch 208 resets the voltage on the capacitor 206 of the CTIA unit cell. The reset of the CTIA unit cell is released at step 1006. This may include, for example, the controller 224 opening the reset switch 208 so that the amplifier 204 of the CTIA unit cell can generate the integration voltage $V_{Int}$ based on the electrical current from the photodetector 202. The release of the reset may, for instance, occur at the beginning of an integration period.

If there is no high flux condition at step 1008, an integration voltage is generated using the CTIA unit cell at step 1010. This may include, for example, the comparator 220 comparing the input voltage $V_{In}$ and the reference voltage $V_{Ref2}$ and determining that no high flux condition is present based on the comparison. This may also include the amplifier 204 generating the integration voltage $V_{Int}$. The integration voltage can be buffered and used to generate an output of the circuit at step 1014. This may include, for example, the buffer 210 buffering the integration voltage $V_{Int}$ and outputting the buffered signal over the column line 212 or in any other suitable manner.

If there is a high flux condition at step 1008, at least one corrective action can be initiated to at least partially account for the high flux condition at step 1012. This may include, for example, the comparator 220 comparing the input voltage $V_{In}$ and the reference voltage $V_{Ref2}$ and determining that a high flux condition is present based on the comparison. One or more corrective actions (including any of those described above) may be triggered based on the output of the comparator 220. For example, the controller 224 may close the switch 602 so that the capacitor 604 is coupled into the feedback path of the amplifier 204. The controller 224 may also or alternatively close the switch 802 so that the current source 804 provides current used by the amplifier 204. The integration voltage that is generated based at least in part on the one or more corrective actions can be buffered and used to generate the output of the circuit at step 1014. This may include, for example, the buffer 210 buffering the integration voltage $V_{Int}$ and outputting the buffered signal over the column line 212 or in any other suitable manner.

A determination is made whether the CTIA unit cell should be reset at step 1016. This may include, for example, the controller 224 determining whether the end of the integration period has been reached or whether some other criterion or criteria have been satisfied. If not, the process can continue by buffering the integration voltage $V_{Int}$ that is being generated by the CTIA unit cell. Otherwise, the process can return to step 1004 in order to reset the CTIA unit cell.

Although FIGS. 9 and 10 illustrate examples of methods 900, 1000 for high flux detection and imaging using CTIA-based unit cells in an imaging device, various changes may be made to FIGS. 9 and 10. For example, while shown as a series of steps, various steps in each of FIGS. 9 and 10 may overlap, occur in parallel, occur in a different order, or occur any number of times (including zero times). As a particular example, while FIG. 10 shows the detection of the high flux event occurring after a CTIA unit cell reset, various embodiments may detect the high flux event and trigger one or more corrective actions at any other suitable times.

The following describes example embodiments of this disclosure that implement or relate to high flux detection and imaging using CTIA-based unit cells in imaging devices. However, other embodiments may be used in accordance with the teachings of this disclosure.

In a first embodiment, an apparatus includes a photodetector configured to generate an electrical current based on received illumination. The apparatus also includes a CTIA unit cell configured to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. The apparatus further includes a comparator configured to compare an input voltage of the amplifier and a second reference voltage, where generation of the integration voltage is modifiable based on the comparison.

Any single one or any suitable combination of the following features may be used with the first embodiment. A bypass switch may be coupled in parallel with a coupling capacitor of the CTIA unit cell, and a clamp switch may be configured to clamp the integration voltage to a specified voltage. The reset and clamp switches may be configured to be closed to reset the CTIA unit cell, and the reset switch may be configured to be opened at a beginning of an integration period. When no high flux condition is detected by the comparator based on the comparison, the clamp switch may be configured to be opened after the beginning of the integration period, and the bypass switch may be configured to remain opened during the integration period. When a high flux condition is detected by the comparator based on the comparison, the clamp switch may be configured to be opened so that the integration voltage is not clamped to the specified voltage, and the bypass switch may be configured to be closed in order to provide a pre-integration voltage generated by the amplifier as the integration voltage. An additional switch and an additional capacitor may be coupled in series with each other and coupled in parallel with the feedback capacitor. When a high flux condition is detected by the comparator based on the comparison, the additional switch may be configured to be closed in order to increase a capacitance in a feedback path of the amplifier. The amplifier may include (i) multiple transistors and a first current source coupled in series and (ii) an additional switch and a second current source coupled in series, where the additional switch and the second current source are coupled in parallel with the first current source. When a high flux condition is detected by the comparator based on the comparison, the additional switch may be configured to be closed in order to increase a slew rate of the amplifier. The comparator may be configured to detect a high flux condition based on the comparison prior to integration of the electrical current, during integration of the electrical current, or after integration of the electrical current. The comparator may be configured to generate a detection signal in response to detecting a high flux condition based on the comparison, and the apparatus may include a controller configured to control operation of the apparatus based on the detection signal in order to modify the generation of the integration voltage. A buffer may be configured to receive the integration voltage and generate an output signal.

In a second embodiment, a system includes a focal plane array having multiple pixel circuit elements. Each pixel circuit element includes a photodetector configured to generate an electrical current based on received illumination. Each pixel circuit element also includes a CTIA unit cell configured to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. Each pixel circuit element further includes a comparator configured to compare an input voltage of the amplifier and a second reference voltage, where generation of the integration voltage is modifiable based on the comparison.

Any single one or any suitable combination of the following features may be used with the second embodiment. Each pixel circuit element may further include a bypass switch coupled in parallel with a coupling capacitor of the CTIA unit cell and a clamp switch configured to clamp the integration voltage to a specified voltage. The reset and clamp switches may be configured to be closed to reset the CTIA unit cell, and the reset switch may be configured to be opened at a beginning of an integration period. In each pixel circuit element, when no high flux condition is detected by the comparator based on the comparison, the clamp switch may be configured to be opened after the beginning of the integration period, and the bypass switch may be configured to remain opened during the integration period. When a high flux condition is detected by the comparator based on the comparison, the clamp switch may be configured to be opened so that the integration voltage is not clamped to the specified voltage, and the bypass switch may be configured to be closed in order to provide a pre-integration voltage generated by the amplifier as the integration voltage. Each pixel circuit element may further include an additional switch and an additional capacitor coupled in series with each other and coupled in parallel with the feedback capacitor. When a high flux condition is detected by the comparator based on the comparison, the additional switch may be configured to be closed in order to increase a capacitance in a feedback path of the amplifier. In each pixel circuit element, the amplifier may include (i) multiple transistors and a first current source coupled in series and (ii) an additional switch and a second current source coupled in series, where the additional switch and the second current source are coupled in parallel with the first current source. When a high flux condition is detected by the comparator based on the comparison, the additional switch may be configured to be closed in order to increase a slew rate of the amplifier. In each pixel circuit element, the comparator may be configured to detect a high flux condition based on the comparison prior to integration of the electrical current, during integration of the electrical current, or after integration of the electrical current. In each pixel circuit element, the comparator may be configured to generate a detection signal in response to detecting a high flux condition based on the comparison, and the system may further include at least one controller configured to control operation of the pixel circuit elements based on the detection signals. Each pixel circuit element may further include a buffer configured to receive the integration voltage and generate an output signal.

In a third embodiment, a method includes generating an electrical current based on received illumination using a photodetector. The method also includes integrating the electrical current using a CTIA unit cell to generate an integration voltage based on the electrical current. The CTIA unit cell includes (i) an amplifier configured to receive the electrical current and a first reference voltage, (ii) a feedback capacitor coupled in parallel across the amplifier, and (iii) a reset switch coupled in parallel across the feedback capacitor. The method further includes comparing an input voltage of the amplifier and a second reference voltage and controlling generation of the integration voltage based on the comparison.

Any single one or any suitable combination of the following features may be used with the third embodiment. A bypass switch may be coupled in parallel with a coupling capacitor of the CTIA unit cell, and a clamp switch may be configured to clamp the integration voltage to a specified voltage. Controlling the generation of the integration voltage may include closing the reset and clamp switches to reset the CTIA unit cell and opening the reset switch at a beginning of an integration period. Controlling the generation of the integration voltage may also include, when no high flux condition is detected based on the comparison, opening the clamp switch after the beginning of the integration period and keeping the bypass switch opened during the integration period. Controlling the generation of the integration voltage may further include, when a high flux condition is detected based on the comparison, opening the clamp switch so that the integration voltage is not clamped to the specified voltage and closing the bypass switch in order to provide a pre-integration voltage generated by the amplifier as the integration voltage. An additional switch and an additional capacitor may be coupled in series with each other and coupled in parallel with the feedback capacitor. Controlling the generation of the integration voltage may include, when a high flux condition is detected based on the comparison, closing the additional switch in order to increase a capacitance in a feedback path of the amplifier. The amplifier may include (i) multiple transistors and a first current source coupled in series and (ii) an additional switch and a second current source coupled in series, where the additional switch and the second current source are coupled in parallel with the first current source. Controlling the generation of the integration voltage may include, when a high flux condition is detected based on the comparison, closing the additional switch in order to increase a slew rate of the amplifier.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a photodetector configured to generate an electrical current based on received illumination;
   a capacitor transimpedance amplifier (CTIA) unit cell configured to generate an integration voltage based on the electrical current, the CTIA unit cell comprising (i) an amplifier configured to receive the electrical current and a first reference voltage, (ii) a feedback capacitor coupled in parallel across the amplifier, and (iii) a reset switch coupled in parallel across the feedback capacitor;

a comparator configured to compare an input voltage of the amplifier and a second reference voltage, wherein generation of the integration voltage is modifiable based on the comparison;
a bypass switch coupled in parallel with a coupling capacitor of the CTIA unit cell; and
a clamp switch configured to clamp the integration voltage to a specified voltage.

2. The apparatus of claim 1, wherein:
the reset and clamp switches are configured to be closed to reset the CTIA unit cell; and
the reset switch is configured to be opened at a beginning of an integration period.

3. The apparatus of claim 2, wherein:
when no high flux condition is detected by the comparator based on the comparison, the clamp switch is configured to be opened after the beginning of the integration period, and the bypass switch is configured to remain opened during the integration period; and
when a high flux condition is detected by the comparator based on the comparison, the clamp switch is configured to be opened so that the integration voltage is not clamped to the specified voltage, and the bypass switch is configured to be closed in order to provide a pre-integration voltage generated by the amplifier as the integration voltage.

4. The apparatus of claim 1, wherein the comparator is configured to detect a high flux condition based on the comparison prior to integration of the electrical current, during integration of the electrical current, or after integration of the electrical current.

5. The apparatus of claim 1, wherein:
the comparator is configured to generate a detection signal in response to detecting a high flux condition based on the comparison; and
the apparatus further comprises a controller configured to control operation of the apparatus based on the detection signal in order to modify the generation of the integration voltage.

6. The apparatus of claim 1, further comprising:
a buffer configured to receive the integration voltage and generate an output signal.

7. An apparatus comprising:
a photodetector configured to generate an electrical current based on received illumination;
a capacitor transimpedance amplifier (CTIA) unit cell configured to generate an integration voltage based on the electrical current, the CTIA unit cell comprising (i) an amplifier configured to receive the electrical current and a first reference voltage, (ii) a feedback capacitor coupled in parallel across the amplifier, and (iii) a reset switch coupled in parallel across the feedback capacitor;
a comparator configured to compare an input voltage of the amplifier and a second reference voltage, wherein generation of the integration voltage is modifiable based on the comparison; and
an additional switch and an additional capacitor coupled in series with each other and coupled in parallel with the feedback capacitor;
wherein, when a high flux condition is detected by the comparator based on the comparison, the additional switch is configured to be closed in order to increase a capacitance in a feedback path of the amplifier.

8. An apparatus comprising:
a photodetector configured to generate an electrical current based on received illumination;

a capacitor transimpedance amplifier (CTIA) unit cell configured to generate an integration voltage based on the electrical current, the CTIA unit cell comprising (i) an amplifier configured to receive the electrical current and a first reference voltage, (ii) a feedback capacitor coupled in parallel across the amplifier, and (iii) a reset switch coupled in parallel across the feedback capacitor; and
a comparator configured to compare an input voltage of the amplifier and a second reference voltage, wherein generation of the integration voltage is modifiable based on the comparison;
wherein the amplifier comprises (i) multiple transistors and a first current source coupled in series and (ii) an additional switch and a second current source coupled in series, the additional switch and the second current source coupled in parallel with the first current source; and
wherein, when a high flux condition is detected by the comparator based on the comparison, the additional switch is configured to be closed in order to increase a slew rate of the amplifier.

9. A system comprising:
a focal plane array comprising multiple pixel circuit elements;
wherein each pixel circuit element comprises:
a photodetector configured to generate an electrical current based on received illumination;
a capacitor transimpedance amplifier (CTIA) unit cell configured to generate an integration voltage based on the electrical current, the CTIA unit cell comprising (i) an amplifier configured to receive the electrical current and a first reference voltage, (ii) a feedback capacitor coupled in parallel across the amplifier, and (iii) a reset switch coupled in parallel across the feedback capacitor;
a comparator configured to compare an input voltage of the amplifier and a second reference voltage, wherein generation of the integration voltage is modifiable based on the comparison;
a bypass switch coupled in parallel with a coupling capacitor of the CTIA unit cell; and
a clamp switch configured to clamp the integration voltage to a specified voltage.

10. The system of claim 9, wherein, in each pixel circuit element:
the reset and clamp switches are configured to be closed to reset the CTIA unit cell; and
the reset switch is configured to be opened at a beginning of an integration period.

11. The system of claim 10, wherein, in each pixel circuit element:
when no high flux condition is detected by the comparator based on the comparison, the clamp switch is configured to be opened after the beginning of the integration period, and the bypass switch is configured to remain opened during the integration period; and
when a high flux condition is detected by the comparator based on the comparison, the bypass switch is configured to be closed in order to provide a pre-integration voltage generated by the amplifier as the integration voltage, and the clamp switch is configured to be opened so that the integration voltage is not clamped to the specified voltage.

12. The system of claim 9, wherein:
  each pixel circuit element further comprises an additional switch and an additional capacitor coupled in series with each other and coupled in parallel with the feedback capacitor; and
  when a high flux condition is detected by the comparator based on the comparison, the additional switch is configured to be closed in order to increase a capacitance in a feedback path of the amplifier.

13. The system of claim 9, wherein, in each pixel circuit element:
  the amplifier comprises (i) multiple transistors and a first current source coupled in series and (ii) an additional switch and a second current source coupled in series, the additional switch and the second current source coupled in parallel with the first current source; and
  when a high flux condition is detected by the comparator based on the comparison, the additional switch is configured to be closed in order to increase a slew rate of the amplifier.

14. The system of claim 9, wherein, in each pixel circuit element, the comparator is configured to detect a high flux condition based on the comparison prior to integration of the electrical current, during integration of the electrical current, or after integration of the electrical current.

15. The system of claim 9, wherein:
  in each pixel circuit element, the comparator is configured to generate a detection signal in response to detecting a high flux condition based on the comparison; and
  the system further comprises at least one controller configured to control operation of the pixel circuit elements based on the detection signals.

16. The system of claim 9, wherein each pixel circuit element further comprises:
  a buffer configured to receive the integration voltage and generate an output signal.

17. A method comprising:
  generating an electrical current based on received illumination using a photodetector;
  integrating the electrical current using a capacitor transimpedance amplifier (CTIA) unit cell to generate an integration voltage based on the electrical current, the CTIA unit cell comprising (i) an amplifier configured to receive the electrical current and a first reference voltage, (ii) a feedback capacitor coupled in parallel across the amplifier, and (iii) a reset switch coupled in parallel across the feedback capacitor;
  comparing an input voltage of the amplifier and a second reference voltage; and
  controlling generation of the integration voltage based on the comparison;
  wherein:
    a bypass switch is coupled in parallel with a coupling capacitor of the CTIA unit cell; and
    a clamp switch is configured to clamp the integration voltage to a specified voltage.

18. The method of claim 17, wherein controlling the generation of the integration voltage comprises:
  closing the reset and clamp switches to reset the CTIA unit cell;
  opening the reset switch at a beginning of an integration period;
  when no high flux condition is detected based on the comparison, opening the clamp switch after the beginning of the integration period and keeping the bypass switch opened during the integration period; and
  when a high flux condition is detected based on the comparison, opening the clamp switch so that the integration voltage is not clamped to the specified voltage and closing the bypass switch in order to provide a pre-integration voltage generated by the amplifier as the integration voltage.

19. The method of claim 17, wherein:
  an additional switch and an additional capacitor are coupled in series with each other and coupled in parallel with the feedback capacitor; and
  controlling the generation of the integration voltage comprises, when a high flux condition is detected based on the comparison, closing the additional switch in order to increase a capacitance in a feedback path of the amplifier.

20. The method of claim 17, wherein:
  the amplifier comprises (i) multiple transistors and a first current source coupled in series and (ii) an additional switch and a second current source coupled in series, the additional switch and the second current source coupled in parallel with the first current source; and
  controlling the generation of the integration voltage comprises, when a high flux condition is detected based on the comparison, closing the additional switch in order to increase a slew rate of the amplifier.

* * * * *